(12) United States Patent
Taniguchi

(10) Patent No.: US 8,615,026 B2
(45) Date of Patent: Dec. 24, 2013

(54) METHOD OF MANUFACTURING SEMICONDUCTOR OPTICAL DEVICE, METHOD OF MANUFACTURING SEMICONDUCTOR OPTICAL LASER ELEMENT, AND SEMICONDUCTOR OPTICAL DEVICE

(75) Inventor: Hidehiro Taniguchi, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 44 days.

(21) Appl. No.: 13/382,599

(22) PCT Filed: Jun. 9, 2010

(86) PCT No.: PCT/JP2010/059770
§ 371 (c)(1),
(2), (4) Date: Jan. 6, 2012

(87) PCT Pub. No.: WO2011/004674
PCT Pub. Date: Jan. 13, 2011

(65) Prior Publication Data
US 2012/0114000 A1 May 10, 2012

(30) Foreign Application Priority Data

Jul. 6, 2009 (JP) .................. 2009-159791
Jul. 6, 2009 (JP) .................. 2009-159792

(51) Int. Cl.
*H01S 5/00* (2006.01)
(52) U.S. Cl.
USPC .................. 372/43.01; 372/44.01; 372/45.01; 372/46.01
(58) Field of Classification Search
USPC .................. 372/43.01, 44.01, 45.01
See application file for complete search history.

(56) References Cited

U.S. PATENT DOCUMENTS 4,961,196 A * 10/1990 Endo ..................... 372/45.01
8,030,224 B2 10/2011 Taniguchi et al.
(Continued)

FOREIGN PATENT DOCUMENTS

| JP | 62 234253 | 10/1987 |
| JP | 2 97015 | 4/1990 |

(Continued)

OTHER PUBLICATIONS

International Search Report issued on Sep. 14, 2010 in PCT/JP2010/059770 filed on Jun. 9, 2010.

(Continued)

*Primary Examiner* — Dung Nguyen
(74) *Attorney, Agent, or Firm* — Oblon, Spivak, McClelland, Maier & Neustadt, L.L.P.

(57) ABSTRACT

A method of manufacturing a semiconductor optical device including a semiconductor layer includes: forming a semiconductor layer; forming a first dielectric film on a first region of a surface of the semiconductor layer; forming a second dielectric film on a second region of the surface of the semiconductor layer, the second dielectric film having a density higher than that of the first dielectric film; and performing a thermal treatment in a predetermined temperature range after the second dielectric film forming, wherein within the temperature range, as the temperature is lowered, a difference increases between a bandgap in the semiconductor layer below the second dielectric film and a bandgap in the semiconductor layer below the first dielectric film due to the thermal treatment.

11 Claims, 18 Drawing Sheets

(56) References Cited

U.S. PATENT DOCUMENTS

| | | |
|---|---|---|
| 2002/0171094 A1 | 11/2002 | Koiso et al. |
| 2004/0066822 A1 | 4/2004 | Ohkubo |
| 2005/0018728 A1 | 1/2005 | Ohkubo |
| 2005/0152419 A1* | 7/2005 | Kishimoto et al. ............. 372/43 |
| 2006/0120424 A1 | 6/2006 | Tanaka |
| 2007/0230530 A1 | 10/2007 | Kashima et al. |
| 2008/0099773 A1* | 5/2008 | Konno et al. .................... 257/96 |
| 2009/0028203 A1 | 1/2009 | Sakashita et al. |

FOREIGN PATENT DOCUMENTS

| | | |
|---|---|---|
| JP | 5 102148 | 4/1993 |
| JP | 7 122816 | 5/1995 |
| JP | 2001-057459 A | 2/2001 |
| JP | 2002 280670 | 9/2002 |
| JP | 2002-299767 A | 10/2002 |
| JP | 2004-119817 A | 4/2004 |
| JP | 2005-045009 A | 2/2005 |
| JP | 2005 64776 | 3/2005 |
| JP | 2006 148032 | 6/2006 |
| JP | 2006 286868 | 10/2006 |
| JP | 2007-103480 A | 4/2007 |
| JP | 2007 158195 | 6/2007 |
| JP | 2007-242718 A | 9/2007 |
| JP | 2007-250637 A | 9/2007 |
| JP | 2009 55002 | 3/2009 |
| WO | WO 02/21578 A1 | 3/2002 |
| WO | 2005 057744 | 6/2005 |

OTHER PUBLICATIONS

Office Action mailed Jul. 9, 2013, in Japanese Patent Application No. 2011-028765, with English-language translation.

* cited by examiner

FIG.1
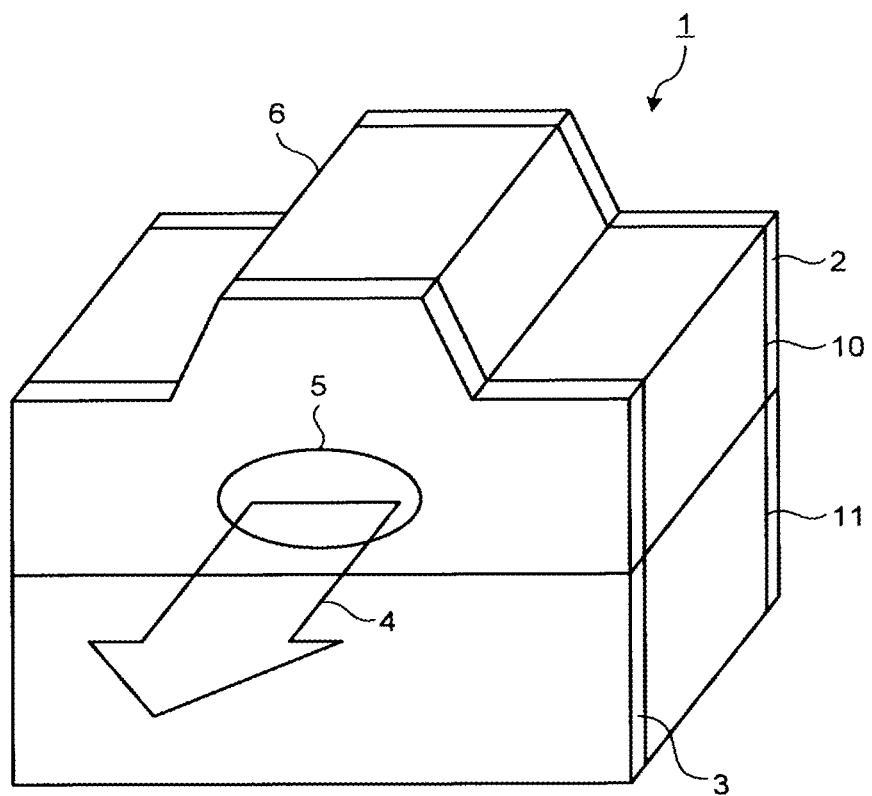
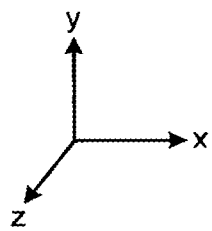

METHOD OF MANUFACTURING SEMICONDUCTOR OPTICAL DEVICE, METHOD OF MANUFACTURING SEMICONDUCTOR OPTICAL LASER ELEMENT, AND SEMICONDUCTOR OPTICAL DEVICE

TECHNICAL FIELD

The present invention relates to a method of manufacturing a semiconductor optical device including a semiconductor layer, a method of manufacturing a semiconductor optical laser element, and a semiconductor optical device.

BACKGROUND ART

As examples of semiconductor optical device, there are optical devices that perform electrical-to-optical conversion and optical-to-electrical conversion, such as light emitting devices and light receiving devices, and there are optical devices that transmit optical signals, such as optical waveguides, optical switches, isolators, and photonic crystals. Such an optical device has a semiconductor laminated structure as a main structure, and a method of manufacturing the optical device may include a thermal treatment process for changing the physical properties of a predetermined semiconductor layer in the semiconductor laminated structure.

For example, in a GaAs-based semiconductor laser, a light emitting end face may be deteriorated due to high light density, which causes a so-called COD (Catastrophic Optical Damage). In order to solve this problem, a method has been proposed which allows a region corresponding to a light emitting surface to have a greater bandgap than a bandgap in an active layer, thereby providing a window region which absorbs less laser light than the inside of the active layer. The window region is formed through the following process. A dielectric film that accelerates the diffusion of Ga is formed in the window region and a dielectric film that suppresses the diffusion of Ga is deposited in a non-window region. After that, a predetermined thermal treatment is performed to cause mixture in a region corresponding to the window region, thereby increasing the bandgap. This method is called an Impurity Free Vacancy Disordering (IFVD) method (see Patent Literature 1). In the process, a $SiN_x$ film which is formed under a N-rich condition is used as the dielectric film which accelerates the diffusion of Ga and a $SiN_x$ film which is formed under a Si-rich condition is used as the dielectric film which suppresses the diffusion of Ga (see Patent Literature 2).

CITATION LIST

Patent Literature

Patent Literature 1: Japanese Patent Application Laid-open No. 7-122816
Patent Literature 2: International Patent Publication No. WO/2005/057744

SUMMARY OF INVENTION

Technical Problem

In the IFVD method, in order to cause the mixture in the window region to obtain a desired bandgap, it is necessary to perform the thermal treatment at a temperature higher than a general thermal treatment temperature. For example, in the method disclosed in Patent Literature 2, it is necessary to perform the thermal treatment at a high temperature of even 930° C. However, when the thermal treatment is performed at such a high temperature, the dielectric film cracks and as a result, the surface of the semiconductor on which the dielectric film is formed has the roughness. Accordingly, there is a problem in that, contact resistance increases in a case in which an electrode is formed subsequently on the rough surface of the semiconductor. In addition, there is another problem in that, when the high-temperature thermal treatment is performed the process of mixture occurs in the non-window region in which the mixture has not been supposed to occur through the thermal treatment, which makes it difficult to obtain the desired laser characteristics.

The invention has been made in view of the above-mentioned problems and an object of the invention is provide a method of manufacturing a semiconductor optical device capable of reducing an adverse effect attributable to a thermal treatment, a method of manufacturing a semiconductor optical laser element, and a semiconductor optical device that does not deteriorate by a thermal treatment.

Solution to Problem

According to one aspect of the present invention, there is provided a method of manufacturing a semiconductor optical device including a semiconductor layer, the method including: a semiconductor layer forming step of forming a semiconductor layer; a first dielectric film forming step of forming a first dielectric film on a first region of a surface of the semiconductor layer; a second dielectric film forming step of forming a second dielectric film on a second region of the surface of the semiconductor layer, the second dielectric film having a density higher than that of the first dielectric film; and a thermal treatment step of performing a thermal treatment in a temperature range in which bandgap variation due to the thermal treatment in the semiconductor layer below the second dielectric film is larger than bandgap variation due to the thermal treatment in the semiconductor layer below the first dielectric film.

In the method of manufacturing a semiconductor optical device, in the thermal treatment step, the thermal treatment is performed in a temperature range in which a gradient of the bandgap variation in the semiconductor layer below the second dielectric film with respect to a thermal treatment temperature is less than a gradient of the bandgap variation in the semiconductor layer below the first dielectric film with respect to the thermal treatment temperature.

In the method of manufacturing a semiconductor optical device, the second dielectric film has a refractive index higher than that of the first dielectric film.

In the method of manufacturing a semiconductor optical device, the second dielectric film is a dielectric film formed of the same material as that of the first dielectric film.

In the method of manufacturing a semiconductor optical device, the first dielectric film and the second dielectric film are dielectric films including silicon, and a silicon composition ratio of the second dielectric film is higher than that of the first dielectric film.

According to another aspect of the invention, there is provided a method of manufacturing a semiconductor optical laser element that includes: a semiconductor layer including an active layer and a contact layer coming into contact with an electrode; and a window region in which a bandgap in the semiconductor layer is greater than that in other regions and which is provided in an end face region along a light emission direction, the method including: a contact layer forming step of forming the contact layer including impurities; a first dielectric film forming step of forming a first dielectric film on a region of a surface of the contact layer, the region corresponding to a non-window region other than the window region; a second dielectric film forming step of forming a second dielectric film on a region of the surface of the contact layer, the region corresponding to the window region; and a thermal treatment step of performing a thermal treatment in a temperature range in which the impurities in the contact layer below the second dielectric film can diffuse such that the impurities in the contact layer below the second dielectric film diffuse more greatly than the impurities in the contact layer below the first dielectric film to form the window region in which mixture is caused in at least a portion of the semiconductor layer below the second dielectric film.

According to still another aspect, there is provided an edge-emitting semiconductor optical device including: a first electrode; a semiconductor substrate; a laminated structure including a first conductive type cladding layer, an active layer, a second conductive type cladding layer, and a contact layer doped with a second conductive type impurity which are sequentially formed on the substrate; a second electrode that is formed on the contact layer such that a current path is formed through the laminated structure between the first electrode and the second electrode; and a window region that is provided at least in the vicinity of an end face of a laser light emitting side and has a bandgap larger than that of a non-window region, wherein a concentration of the second conductive type impurity in the window region of the contact layer is less than that of the second conductive type impurity in the non-window region of the contact layer.

In the semiconductor optical device, the concentration of the second conductive type impurity in the window region of the contact layer is less than the concentration of the second conductive type impurity in the non-window region of the contact layer by $2\times10^{17}$ cm$^{-3}$ or more.

In the semiconductor optical device, a current-confined layer is formed in the window region between the contact layer and the active layer.

In the semiconductor optical device, the current-confined layer extends from the window region to a portion of the non-window region.

In the semiconductor optical device, the semiconductor layer has a laminated structure of a plurality of semiconductor layers, and the current-confined layer has a lattice constant larger than those of the semiconductor layers formed above and below the current-confined layer.

The semiconductor optical device according to the invention further includes: a diffusion layer that includes a diffusing species and is provided between the contact layer and the active layer.

The semiconductor optical device further includes: a diffusion layer that includes a diffusing species and is provided below the current-confined layer.

In the semiconductor optical device, the substrate and the laminated structure are made of a group III-V compound.

In the semiconductor optical device, the second conductive type impurity is Zn, Mg, or Be.

In the semiconductor optical device, the diffusing species is any one of a p-type impurity including Zn, Mg, or Be, an n-type impurity including Si or Se, an interface impurity including O, C, H, or S, and holes.

According to still another aspect, there is provided a communication system including: a transmitter including one of the above-mentioned semiconductor optical devices; an optical fiber that is optically connected to the transmitter at one end of the optical fiber and has a length of 2 km or more; and a receiver that is optically coupled to the optical fiber at the other end of the optical fiber.

Advantageous Effects of Invention

According to the invention, the first dielectric film is formed on the first region of the surface of the semiconductor layer; the second dielectric film with a density higher than that of the first dielectric film is formed on the second region of the surface of the semiconductor layer; and a thermal treatment is performed in the temperature range in which bandgap variation due to the thermal treatment in the semiconductor layer below the second dielectric film is larger than bandgap variation due to the thermal treatment in the semiconductor layer below the first dielectric film, thereby changing the crystalline state of at least a portion of the semiconductor layer below the second dielectric film. In this way, it is possible to reduce the processing temperature of the thermal treatment process, resulting in a reduction in adverse effects due to the thermal treatment and hence the achievement of a semiconductor optical device and a semiconductor laser element that do not deteriorate due to the thermal treatment.

BRIEF DESCRIPTION OF DRAWINGS

FIG. 1 is a perspective view illustrating a semiconductor laser manufactured by a semiconductor laser element manufacturing method according to an embodiment.

DESCRIPTION OF EMBODIMENTS

Figure 2:
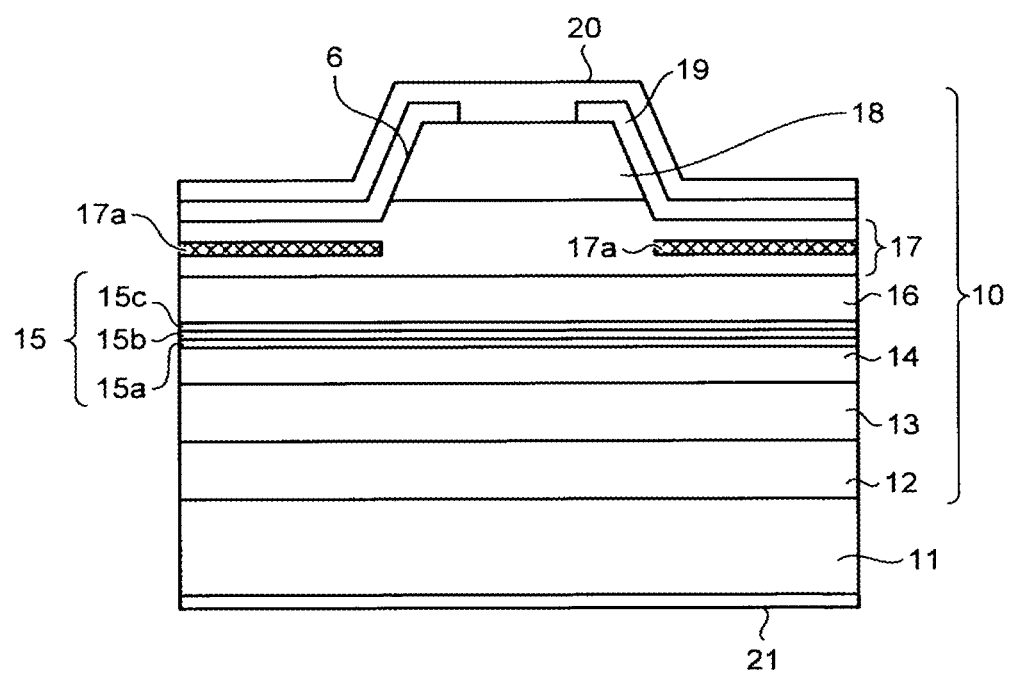
FIG. 2 is a cross-sectional view taken along the plane vertical to the z-axis of FIG. 1.

Hereinafter, a method of manufacturing a semiconductor laser element will be described as an example of a method of manufacturing a semiconductor optical device according to embodiments of the invention. The invention is not limited by the embodiments. In the drawings, the same components are denoted by the same reference numerals. It is noted that the drawings are schematically illustrated and, for example, the thickness and width of each layer and the scale of each layer are different from the actual dimensions. In the drawings, the same component may have different dimensions and scales.

First Embodiment

First, a method of manufacturing a semiconductor laser element according to a first embodiment will be described. FIG. 1 is a perspective view illustrating a semiconductor laser manufactured by the method of manufacturing a semiconductor laser element according to this embodiment. A predetermined process is performed on a semiconductor laser element 1 shown in FIG. 1 to give the shape of a ridge 6, so that the semiconductor laser element 1 has the basic structure in which a semiconductor laminated structure 10 of a plurality of GaAs-based semiconductor layers including an active layer is formed on a substrate 11.

In the semiconductor laser element 1, the semiconductor substrate 11 which is integrated with the semiconductor laminated structure 10 is cleaved at both ends of the ridge 6 in the longitudinal direction. The semiconductor laser element 1 has two cleavage surfaces. A low-reflection film 3 is formed on one of the two cleavage surfaces in order to emit laser light 4, which is generated by oscillating light generated in the active layer of the semiconductor laminated structure 10 using the two cleavage surfaces as reflecting mirrors, from an emission region 5 of the semiconductor laser element 1 to the outside of the semiconductor laser element 1. A high-reflection film 2 is formed on the other cleavage surface in order to effectively emit the generated laser light 4 from the low-reflection film 3 to the outside of the semiconductor laser element 1.

Figure 3:
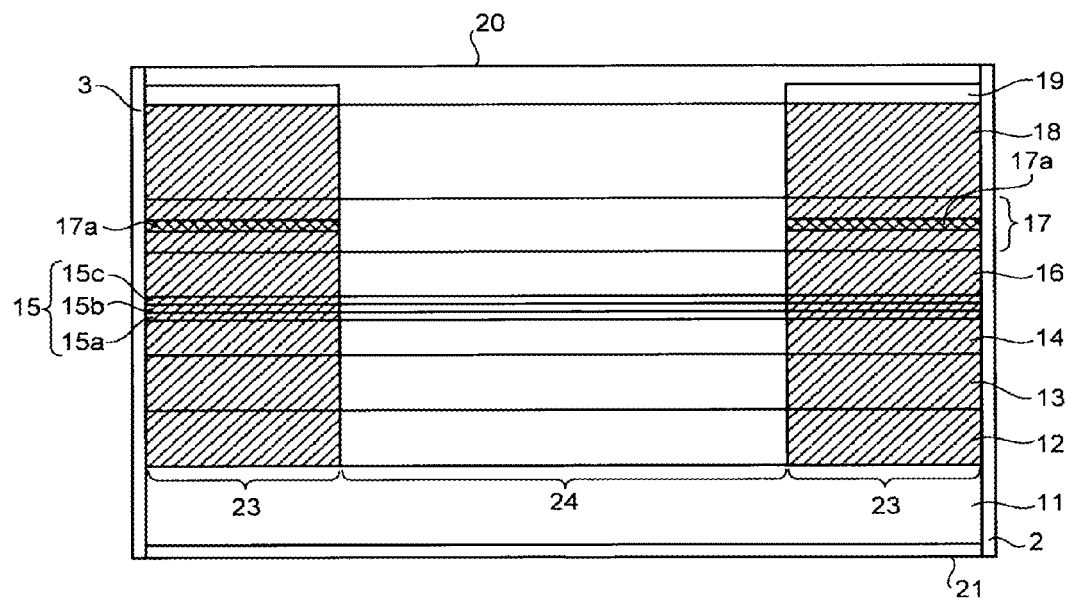
FIG. 3 is a cross-sectional view taken along the plane that is vertical to the x-axis of FIG. 1 and that passes through a ridge portion.

Next, the structure of the semiconductor laser element 1 shown in FIG. 1 will be described with reference to FIGS. 2 and 3. FIG. 2 is a cross-sectional view illustrating the detailed structure of the semiconductor laser element 1 shown in FIG. 1 which is taken along the plane vertical to the z-axis (light emission direction) of FIG. 1. FIG. 3 is a cross-sectional view taken along the plane which is vertical to the z-axis of FIG. 1 and passes through the ridge 6 (that is, the plane including an oscillator of the semiconductor laser element).

As shown in FIGS. 2 and 3, the semiconductor laser element 1 includes an n-buffer layer 12, an n-cladding layer 13, an n-guide layer 14, an active layer 15, a p-guide layer 16, a p-cladding layer 17, a p-contact layer 18, and an insulation layer 19 which are sequentially laminated on the substrate 11, which is an n-type GaAs substrate. In addition, the semiconductor laser element 1 includes an upper electrode 20 formed on the p-contact layer 18 and a lower electrode 21 formed on the lower surface of the substrate 11. The p-guide layer 16 formed on the active layer 15, the p-cladding layer 17 which is formed on the side where a p-type clad is laminated on the active layer 15, and the p-contact layer 18 which is formed in order to inject holes into the active layer 15 are doped with Zn, which is an impurity. As shown in FIGS. 2 and 3, the semiconductor laser element 1 has the ridge 6 that confines the current injected into the active layer 15 in a stripe shape and functions as an optical waveguide along the stripe and is processed into a mesa shape in which the width of a layer region including the upper side of the p-cladding layer 17 and the p-contact layer 18 is reduced in a direction vertical to the direction in which the laser light is emitted. A window region 23 that absorbs less laser light than a non-window region 24 is provided in a light emitting end face of the semiconductor laser element 1.

The substrate 11 includes n-GaAs as a material. The n-buffer layer 12 is a buffer layer required to grow a laminated structure of high-quality epitaxial layers on the substrate 11 and includes n-GaAs as a material. The n-cladding layer 13 and the n-guide layer 14 have a refractive index and a thickness which are determined so as to represent a light-confined state in an arbitrary direction with respect to the laminated direction and include n-AlGaAs as a material. It is preferable that the Al composition of the n-guide layer 14 be equal to or greater than 20% and less than 40%. In addition, in general, the Al composition of the n-cladding layer 13 is greater than that of the n-guide layer 14 in order to reduce the refractive index. In the high-power edge emitting multi-mode semiconductor laser element according to the invention in which the window region is formed, it is preferable that the thickness of the n-guide layer 14 be equal to or greater than 200 nm, for example, about 400 nm. The thickness of the n-cladding layer 13 may be equal to or greater than 1 μm, for example, about 3 μm. A high-purity layer which is intentionally undoped may be used as the n-guide layer 14. When the thickness of the n-guide layer 14 is set to 100 nm or greater, the n-guide layer 14 is greatly affected by residual impurities. Therefore, it is preferable that the n-guide layer 14 be doped with impurities. In this embodiment, the edge emitting multi-mode semiconductor laser element is given as an example. However, the invention may be applied to an edge emitting single-mode semiconductor laser element.

The active layer 15 includes a lower barrier layer 15a, a quantum well layer 15b, and an upper barrier layer 15c. Each of the lower barrier layer 15a and the upper barrier layer 15c functions as a barrier for confining a current in the quantum well layer 15b and include high-purity AlGaAs that is intentionally undoped as a material. The quantum well layer 15b also includes high-purity InGaAs that is intentionally undoped as a material. The radiating recombination energy of confined carriers is determined by the structure of a potential well which is determined by the In composition and thickness of the quantum well layer 15b and the compositions of the lower barrier layer 15a and the upper barrier layer 15c. In this embodiment, the structure of a single quantum well layer (SQW) is described. However, the structure of a multi-quantum well layer (MQW) in which the quantum well layer 15b, the lower barrier layer 15a, and the upper barrier layer 15c are laminated a desired number of times may be used. In this embodiment, the high-purity layer that is intentionally undoped is described. However, donors or acceptors may be intentionally added to the quantum well layer 15b, the lower barrier layer 15a, and the upper barrier layer 15c. In addition, the lower barrier layer 15a and the n-guide layer 14 may have the same composition and the upper barrier layer 15c and the p-guide layer 16 may have the same composition. In this case, the lower barrier layer 15a and the upper barrier layer 15c may not be provided.

The p-guide layer 16 and the p-cladding layer 17 correspond to the n-cladding layer 13 and the n-guide layer 14 and the refractive index and thickness of the p-guide layer 16 and the p-cladding layer 17 are determined so as to obtain an arbitrary light-confined state in the laminated direction. The p-guide layer 16 and the p-cladding layer 17 include p-AlGaAs as a material. In general, the Al composition of the p-guide layer 16 is equal to or greater than 20% and is preferably equal to or greater than 30%. In general, the Al composition of the p-cladding layer 17 is in the range of about 40% to about 50%. The Al composition of the p-cladding layer 17 is set to be slightly greater than that of the n-cladding layer 13 in order to shift an optical field in the layer in the direction of the n-cladding layer 13 to reduce waveguide loss. The Al composition of the p-guide layer 16 is set to be less than the Al composition of the p-cladding layer 17. In the high-power edge emitting multi-mode laser element according to the invention in which the window region is formed, it is preferable that the thickness of the p-guide layer 16 be equal to or greater than 200 nm, for example, about 400 nm. The thickness of the p-cladding layer 17 may be in the range of about 1 μm to about 2 μm. A high-purity layer that is intentionally undoped may be used as the p-guide layer 16. When the thickness of the guide layer is equal to or greater than 100 nm, the guide layer is greatly affected by a conductive variation due to residual impurities. Therefore, the guide layer may be intentionally doped with impurities in order to improve manufacturing reproducibility. A current-confined layer 17a that is an n-type semiconductor layer and confines the injected current to increase the current density of the active layer 15 is formed in the p-cladding layer 17. The p-contact layer 18 needs to come into contact with the electrode in order to inject holes into the active layer 15. Therefore, the p-contact layer 18 is heavily doped with Zn, which is a p-type impurity.

In the semiconductor laser element 1, the current injected from the upper electrode 20 and the lower electrode 21 is concentrated on a portion of the active layer 15 by the ridge 6 which is formed by processing a portion of the semiconductor laminated structure 10 and the laser light 4 is emitted to the outside of the semiconductor laser element 1. The intensity of the laser light 4 emitted from the emission region 5 (see FIG. 1) is high. Therefore, in the semiconductor laser element 1, the window region 23 that absorbs little laser light is provided in a predetermined region including the light emitting end face and the non-window region 24 is provided in the other regions. In this way, the occurrence of COD is prevented.

In the window region 23, mixture occurs in at least some of the semiconductor layers forming the semiconductor laminated structure 10 of the window region 23. The mixture can bring about an increase in the energy bandgap of the window region 23. As a result, there is a difference between the energy bandgap of the non-window region 24 and the energy bandgap of the window region 23. Therefore, in the semiconductor laser element 1, the absorption of laser light by a light emitting end face region is prevented and the occurrence of COD is prevented.

Figure 4:
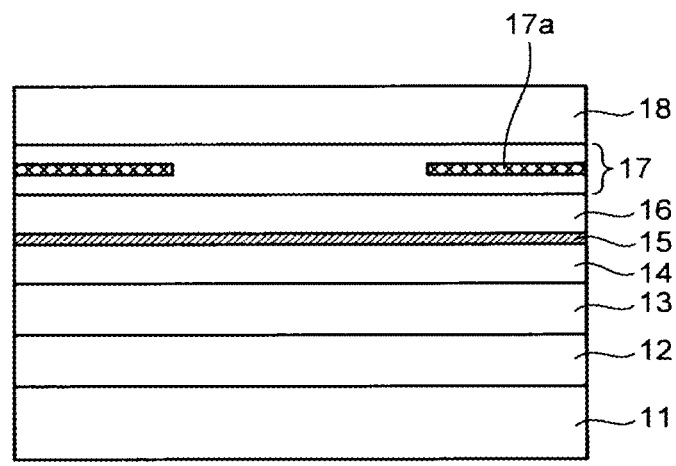
FIG. 4 is a cross-sectional view illustrating a process of manufacturing the semiconductor laser element shown in FIG. 1, which is taken along the plane vertical to the x-axis of the semiconductor laser element shown in FIG. 1.
Figure 5:
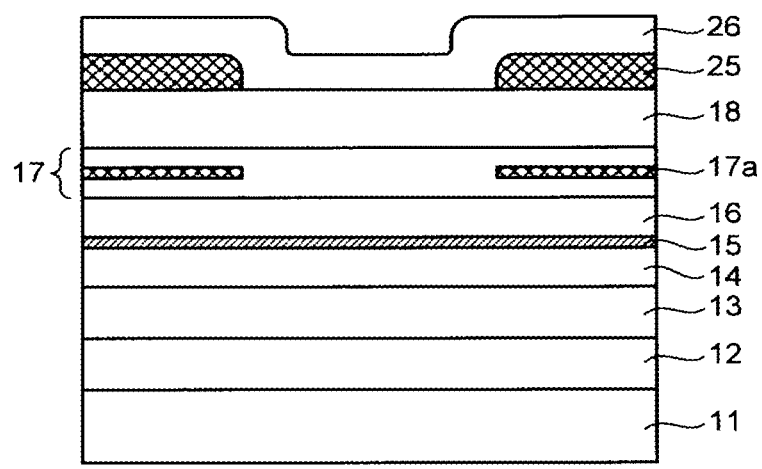
FIG. 5 is a cross-sectional view illustrating the process of manufacturing the semiconductor laser element shown in FIG. 1, which is taken along the plane vertical to the x-axis of the semiconductor laser element shown in FIG. 1.
Figure 6:
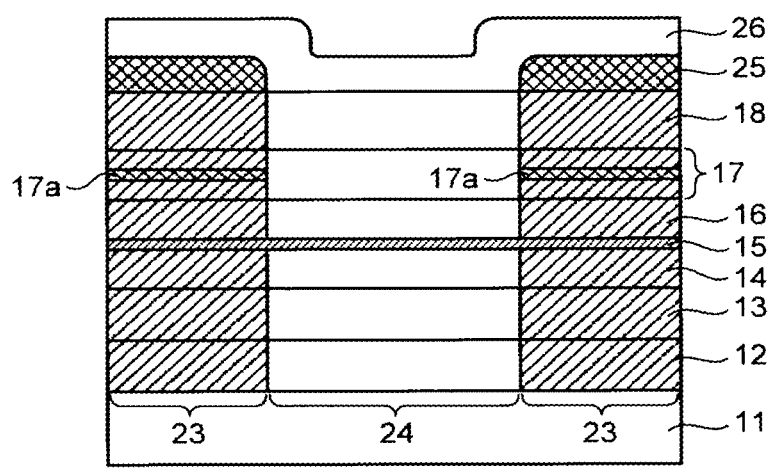
FIG. 6 is a cross-sectional view illustrating the process of manufacturing the semiconductor laser element shown in FIG. 1, which is taken along the plane vertical to the x-axis of the semiconductor laser element shown in FIG. 1.
Figure 7:
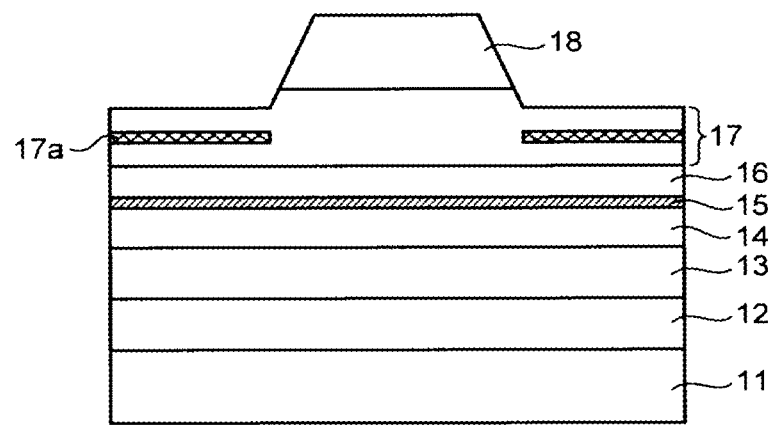
FIG. 7 is a cross-sectional view illustrating the process of manufacturing the semiconductor laser element shown in FIG. 1, which is taken along the plane vertical to the z-axis of the semiconductor laser element shown in FIG. 1.
Figure 8:
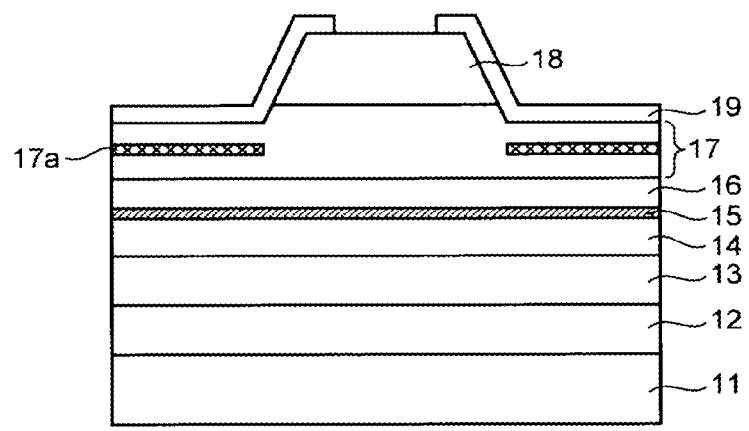
FIG. 8 is a cross-sectional view illustrating the process of manufacturing the semiconductor laser element shown in FIG. 1, which is taken along the plane vertical to the z-axis of the semiconductor laser element shown in FIG. 1.

Next, a process of manufacturing the semiconductor laser element 1 will be described with reference to FIGS. 4 to 8. FIGS. 4 to 6 are cross-sectional views illustrating the process of manufacturing the semiconductor laser element shown in FIG. 1, which are taken along the plane vertical to the x-axis of the semiconductor laser element in FIG. 1. FIGS. 7 and 8 are cross-sectional views illustrating the process of manufacturing the semiconductor laser element shown in FIG. 1, which are taken along the plane vertical to the z-axis of the semiconductor laser element in FIG. 1. As shown in FIG. 4, an MOCVD apparatus using a general MOCVD (Metal Organic Chemical Vapor Deposition) method is used to epitaxially grow the semiconductor laminated structure 10 including the n-buffer layer 12, the n-cladding layer 13, the n-guide layer 14, the active layer 15, the p-guide layer 16, the p-cladding layer 17, the current-confined layer 17a, and the p-contact layer 18 on the GaAs semiconductor substrate 11. When the semiconductor laminated structure 10 is epitaxially grown, in order to impart conductivity to a predetermined semiconductor layers a doping process is performed in the process of epitaxial growth, in which the n-buffer layer 12 and the n-cladding layer 13 are doped with Si, which is an n-type impurity, and the p-cladding layer 17 and the p-contact layer 18 are doped with Zn, which is a p-type impurity. In addition, the semiconductor layers including n-type impurities are formed so as to correspond to only the window region. In this way, the current-confined layer 17a is formed in the p-cladding layer 17.

A SiN$_x$ film is deposited on the surface of the p-contact layer 18 by a catalyst CVD (Chemical Vapor Deposition) method. In this embodiment, the catalyst CVD is used to grow the SiN$_x$ film. However, other methods, such as a plasma CVD method, may be used for the purpose of use. The SiN$_x$ film is formed under a Si-rich condition in which the flow rate of SiH$_4$ is significantly high and is a dense film having a Si concentration greater than a stoichiometry composition. Then, a photolithography process and an etching process are performed to remove the SiN$_x$ film in the regions other than the window region 23. In this way, as shown in FIG. 5, a mixture-promoting film 25 is formed on the region corresponding to the window region 23 in the surface of the p-contact layer 18. The mixture-promoting film 25 is formed so as to cover the active layer 15 on the front and the rear sides of the semiconductor laser element 1 in the longitudinal direction.

Then, the catalyst CVD method is used to deposit a SiN$_x$ film with the same material as that forming the mixture-promoting film 25 on the p-contact layer 18 and the mixture-promoting film 25 under a N-rich condition, thereby forming a mixture-suppression film 26. The SiN$_x$ film forming the mixture-suppression film 26 has a N composition greater than the stoichiometry composition and is formed in an ammonia-rich state in which the flow rate of silane and ammonia gas, which are raw materials, is high. The mixture-suppression film 26 is a SiN$_x$ film which is formed under the N-rich condition. Therefore, the mixture-suppression film 26 is a sparse film with a density lower than that of the mixture-promoting film 25 which is formed under the Si-rich condition. In other words, the mixture-promoting film 25 formed on the region corresponding to the window region 23 is a dense film with a density higher than that of the mixture-suppression film 26 which is formed on the region corresponding to the non-window region 24. In the dielectric films made of the same material, as density increases, the refractive index increases. Therefore, the mixture-promoting film 25 formed on the region corresponding to the window region 23 has a refractive index higher than that of the mixture-suppression film 26 formed on the region corresponding to the non-window region 24. For example, the mixture-promoting film 25 is a SiN$_x$ film having a refractive index of 2.05 and the mixture-suppression film 26 is a SiN$_x$ film having a refractive index of 1.85. The SiN$_x$ film which is formed as the mixture-promoting film 25 under the Si-rich condition diffuses impurities in the semiconductor layer which is disposed immediately below the mixture-promoting film 25 when a thermal treatment is performed.

After the mixture-promoting film 25 and the mixture-suppression film 26 are formed, a thermal treatment process is performed on the semiconductor laminated structure 10. An RTA (Rapid Thermal Annealing) apparatus is used to perform the thermal treatment. In the thermal treatment process, the thermal treatment is performed in the temperature range in which bandgap variation due to the thermal treatment in the semiconductor layer below the mixture-promoting film 25 is larger than bandgap variation due to the thermal treatment in the semiconductor layer below the mixture-suppression film 26. As the thermal treatment process, an RTA process is performed at 775° C. for 180 seconds. When the thermal treatment is performed, Zn in the semiconductor layer immediately below the mixture-promoting film 25, that is, the p-contact layer 18 is diffused into the semiconductor laminated structure 10, that is, the lower layer. The thermal treatment makes the diffusion amount of Zn in the p-contact layer 18 below the mixture-promoting film 25 greater than that of Zn in the p-contact layer 18 below the mixture-suppression film 26. Therefore, as shown in FIG. 6, mixture is caused in at least a portion of at least one layer of the semiconductor laminated structure 10 in the region in which the mixture-promoting film 25 is formed. As a result, the bandgap variation due to the thermal treatment in the semiconductor layer below the mixture-promoting film 25 is larger than the bandgap variation due to the thermal treatment in the semiconductor layer below the mixture-suppression film 26, and thus the window region 23 is formed below the mixture-promoting film 25. The region in which the mixture-suppression film 26 is formed becomes the non-window region 24 in which the mixture is not caused.

After the promoting film 25 and the suppression film 26 are removed, a photolithography process and an etching process are performed. As shown in FIG. 7, when the p-contact layer 18 is needed in the region other than the region which comes into contact with the upper electrode 20, a portion of the layer above the p-cladding layer 17 is removed to form the ridge structure. Then, the insulation layer 19 is formed and then a photolithography process and an etching process are performed to remove a portion of the insulation layer 19 in a region other than the region which comes into contact with the upper electrode 20, as shown in FIG. 8. Then, the upper electrode 20 and the lower electrode 21 are formed and then the semiconductor wafer is cleaved. Next, the high-reflection film 2 and the low-reflection film 3 are formed on the cleavage surfaces. Then, the semiconductor laser elements 1 are individually cut. Finally, the semiconductor laser element 1 is obtained.

As described above, in the first embodiment, the SiN$_x$ film is formed as the mixture-suppression film 26 on the semiconductor laminated structure 10 corresponding to the non-window region 24 under the N-rich condition, and a Si-rich SiN$_x$ film, which has a higher refractive index and a density higher than that of the SiN$_x$ film formed under the N-rich condition, is formed as the mixture-promoting film 25 on the semiconductor laminated structure 10 corresponding to the window region 23. In the preferred embodiment, the Si or N composition of the SiN$_x$ film is described using the magnitude relation between the Si or N composition of the SiN$_x$ film and the stoichiometry composition. However, if there is a sufficient density difference or refractive index difference, the embodiment is not limited thereto.

Figure 9:
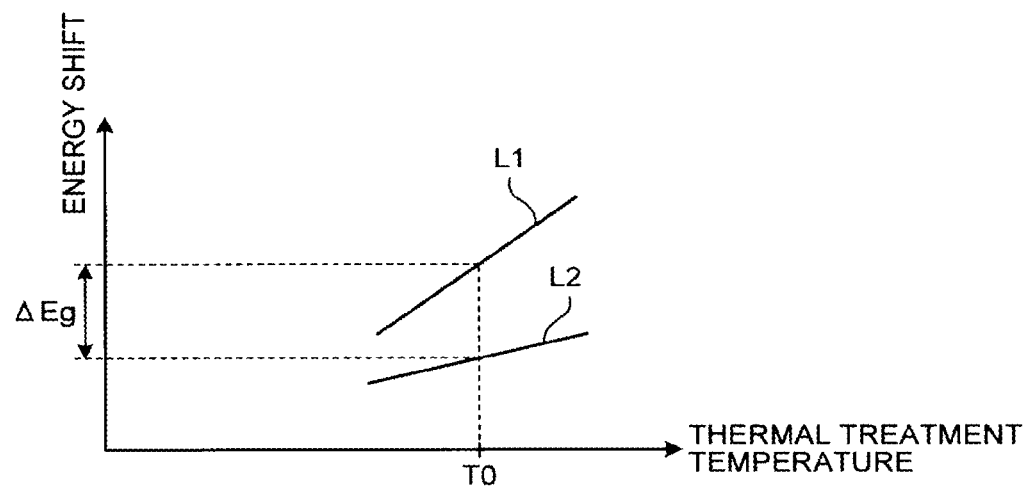
FIG. 9 is a diagram illustrating the relation between thermal treatment temperature of RTA and bandgap variation due to the thermal treatment in a semiconductor layer.

FIG. 9 shows the relation between the thermal treatment temperature of RTA and the bandgap variation due to the thermal treatment in the semiconductor layer. Hereinafter, the bandgap variation due to the RTA process in the semiconductor laminated structure will be described as an energy shift. In FIG. 9, a straight line L1 corresponds to a case in which a thermal treatment is performed in a state in which a SiN$_x$ film, which is a low refractive index film, is formed on the semiconductor layer under a N-rich condition and a straight line L2 corresponds to a case in which a thermal treatment is performed in a state in which a SiN$_x$ film, which is a high refractive index film, is formed on the semiconductor layer under a Si-rich condition.

In the semiconductor laser element, in order to prevent COD, the bandgap of the window region needs to be greater than that of the non-window region in the active layer to ensure a sufficient difference between the bandgap of the non-window region and the bandgap of the window region.

In the related art, in order to ensure a bandgap difference ΔEg capable of preventing COD, a low refractive index film that has a large energy shift in a high-temperature range is used as the mixture-promoting film to form the window region, as represented by the straight line L1, and a high refractive index film that has a small energy shift in the high-temperature range is used as the mixture-suppression film to form the non-window region, as represented by the straight line L2. That is, in the related art, a $SiN_x$ film with a low refractive index, which is a sparse film, is formed as the mixture-promoting film on the semiconductor layer corresponding to the window region including a laser light emitting end face and a Si-rich $SiN_x$ film that has a high refractive index and a density higher than that of the $SiN_x$ film formed under the N-rich condition is formed as the mixture-suppression film on the semiconductor laminated structure 10 corresponding to the non-window region. In addition, in the related art, a thermal treatment is performed at a temperature T0 capable of ensuring the bandgap difference ΔEg such that the diffused Ga is absorbed by the mixture-promoting film, which is a sparse film. The holes generated by the absorption are diffused into the active layer 15. In this way, mixture is caused in the quantum well layer 15b below the mixture-promoting film and the window region is formed.

However, in the related art, in order to achieve the mixture, it is necessary to perform a thermal treatment at a high temperature of, for example, even 930° C. When the thermal treatment is performed at a high temperature, a crack occurs in the $SiN_x$ films formed as the mixture-promoting film and the mixture-suppression film. As a result, the semiconductor on which the $SiN_x$ film is formed comes to have a rough surface, which increases contact resistance when an electrode is formed on the surface of the semiconductor. In addition, the high-temperature treatment causes the process of mixture to occur in the non-window region in which the occurrence of the process of mixture is not desirable. As a result, the desired laser characteristics are not obtained.

In the first embodiment, regarding the gradient of the energy shift of the semiconductor laminated structure with respect to the RTA temperature, that is, the rate of change in the energy shift of the semiconductor laminated structure with respect to the RTA temperature, noticing that the gradient in the case of forming the high refractive index film is less than the gradient in the case of forming the low refractive index film; a thermal treatment is performed in the temperature region in which the magnitude relation between an energy shift corresponding to the high refractive index film and an energy shift corresponding to the low refractive index film is reversed, that is, in the temperature region in which the bandgap variation due to the thermal treatment in the semiconductor layer below the high refractive index film is larger than the bandgap variation due to the thermal treatment in the semiconductor layer below the low refractive index film. The thermal treatment temperature is a temperature region in which the gradient of the bandgap variation of the semiconductor laminated structure below the high refractive index film with respect to the RTA temperature is less than the gradient of the bandgap variation of the semiconductor laminated structure below the low refractive index film with respect to the RTA temperature.

Figure 10:
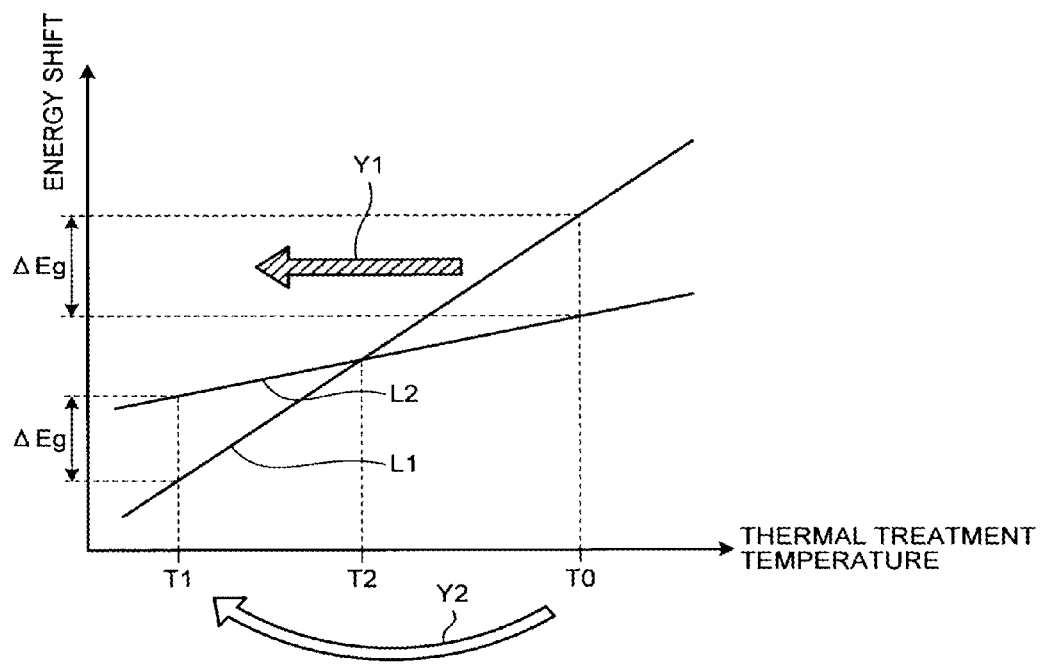
FIG. 10 is a diagram illustrating the relation between the thermal treatment temperature of RTA and the bandgap variation due to the thermal treatment in the semiconductor layer.

Specifically, in the first embodiment, as represented by an arrow Y1 in FIG. 10, each energy shift at a temperature lower than the temperature T0 is calculated, and furthermore a temperature region in which the magnitude relation between an energy shift corresponding to the high refractive index film and an energy shift corresponding to the low refractive index film is reverse to the magnitude relation at the temperature T0 which is the thermal treatment temperature according to the related art is calculated. That is, in the temperature region, the energy shift corresponding to the high refractive index film is greater than the energy shift corresponding to the low refractive index film.

As shown in FIG. 10, the temperature region is less than a temperature T2 at which a straight line L2 corresponding to the high refractive index film intersects a straight line L1 corresponding to the low refractive index film. The thermal treatment temperature at which the bandgap difference ΔEg capable of preventing COD can be ensured is a temperature T1 that is significantly lower than the thermal treatment temperature T0 according to the related art, as represented by an arrow Y2 in FIG. 10. Therefore, in the first embodiment, the high refractive index film is formed as the mixture-promoting film 25 on the semiconductor laminated structure 10 corresponding to the window region 23 and the low refractive index film is formed as the mixture-suppression film 26 on the semiconductor laminated structure 10 corresponding to the non-window region 24. Then, the thermal treatment process is performed at the temperature T1 to make the bandgap of the semiconductor layer below the mixture-promoting film 25, which is the high refractive index film, greater than the bandgap of the semiconductor layer below the mixture-suppression film 26, which is the low refractive index film, by ΔEg.

Figure 11:
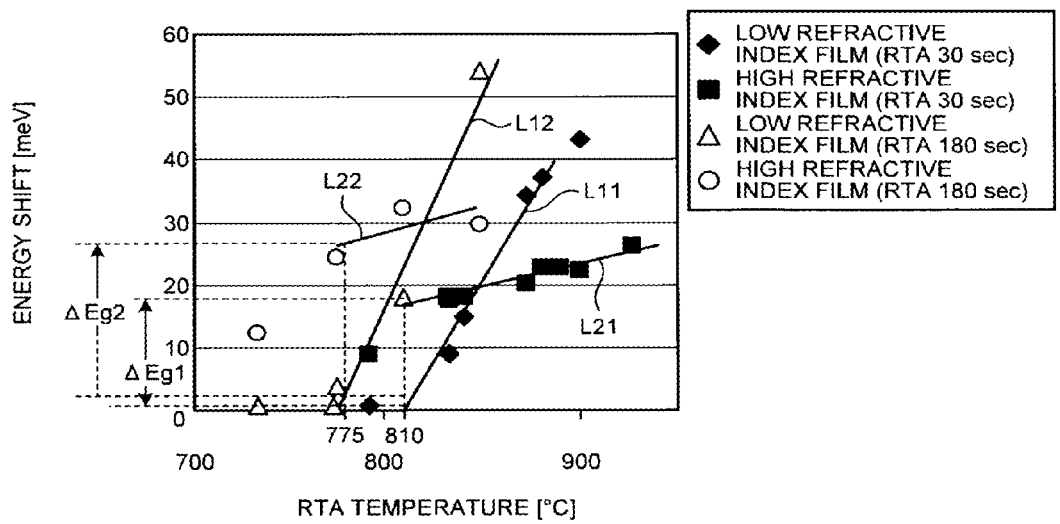
FIG. 11 is a diagram illustrating the relation between the thermal treatment temperature of RTA and the bandgap variation due to the thermal treatment in the semiconductor layer.

FIG. 11 shows the relation between the thermal treatment temperature of RTA and an energy shift when the high refractive index film is actually formed on the semiconductor laminated structure 10 corresponding to the window region 23 and the low refractive index film is actually formed on the semiconductor laminated structure 10 corresponding to the non-window region 24. A straight line L11 corresponds to a case in which the RTA process is performed for 30 seconds in a state in which a $SiN_x$ film, which is a low refractive index film, is formed on the semiconductor laminated structure under a N-rich condition and a straight line L21 corresponds to a case in which the RTA process is performed for 30 seconds in a state in which a $SiN_x$ film, which is a high refractive index film, is formed on the semiconductor laminated structure under a Si-rich condition. A straight line L12 corresponds to a case in which the RTA process is performed for 180 seconds in a state in which a $SiN_x$ film, which is a low refractive index film, is formed on the semiconductor laminated structure under the N-rich condition and a straight line L22 corresponds to a case in which the RTA process is performed for 180 seconds in a state in which a $SiN_x$ film, which is a high refractive index film, is formed on the semiconductor laminated structure under the Si-rich condition.

As can be seen from FIG. 11, at any RTA processing time, there is a region in which an energy shift corresponding to the high refractive index film is greater than an energy shift corresponding to the low refractive index film as the RTA processing temperature is lowered. For example, when the RTA processing time is 30 seconds, the energy shift corresponding to the high refractive index film is greater than the energy shift corresponding to the low refractive index film at a temperature of about less than 850° C. Therefore, when the RTA processing time is 30 seconds, the process can be performed at a temperature of about 810° C. to ensure a bandgap difference ΔEg1 greater than the bandgap difference ΔEg capable of preventing COD. Therefore, in the first embodiment, the high refractive index film is formed as the mixture-promoting film 25 on the semiconductor laminated structure 10 corresponding to the window region 23 and the low refractive index film is formed as the mixture-suppression film 26 on the semiconductor laminated structure 10 corresponding to the non-window region 24. Then, for example, as the thermal treatment process, the RTA process is performed at 810° C. for 30 seconds.

As represented by the straight line L12 and the straight line L22, when the RTA processing time is 180 seconds, a straight line indicating the relation between an energy shift and the RTA processing temperature shifts to the lower temperature side, as compared to when the RTA processing time is 30 seconds. Therefore, when the RTA processing time is 180 seconds, an energy shift corresponding to the high refractive index film is greater than an energy shift corresponding to the low refractive index film at a temperature of less than about 820° C. which is less than that when the RTA processing time is 30 seconds. When the RTA processing time is 180 seconds, the process can be performed at a temperature of about 775° C. to ensure a bandgap difference ΔEg2 greater than the bandgap difference ΔEg1 ensured by the RTA process which is performed at 810° C. for 30 seconds. Therefore, in the first embodiment, the high refractive index film is formed as the mixture-promoting film 25 on the semiconductor laminated structure 10 corresponding to the window region 23 and the low refractive index film is formed as the mixture-suppression film 26 on the semiconductor laminated structure 10 corresponding to the non-window region 24. Then, for example, as the thermal treatment process, the RTA process is performed at 775° C. for 180 seconds. The above-mentioned thermal treatment conditions may be changed and the thermal treatment may be performed at a low temperature. The thermal treatment time may increase such that the thermal treatment temperature is equal to or less than a semiconductor layer growth temperature.

Figure 12:
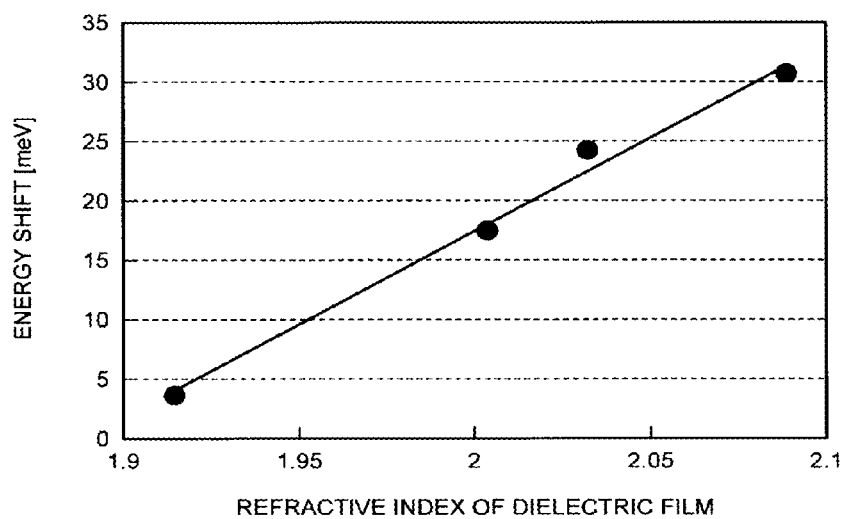
FIG. 12 is a diagram illustrating the relation between the refractive index of a laminated dielectric film and the energy shift of the semiconductor layer on which the film is formed when an RTA process is performed at 775° C. for 180 seconds.

The high refractive index film to be formed as the mixture-promoting film 25 and the low refractive index film to be formed as the mixture-suppression film 26 may be selected on the basis of the relation between the refractive indexes of the dielectric films to be formed and the relation between the energy shifts of the semiconductor laminated structures having the films formed on the surfaces thereof. FIG. 12 is a diagram illustrating the relation between the refractive index of the dielectric film to be formed and the energy shift of the semiconductor layer having the film formed on the surface thereof when the RTA process is performed at 775° C. for 180 seconds. As shown in FIG. 12, in the case in which the RTA process is performed at 775° C. for 180 seconds, as the refractive index increases, the energy shift increases and, as the refractive index is reduced, the energy shift is reduced. Therefore, the refractive index of the dielectric film which is formed as the mixture-promoting film 25 and the refractive index of the dielectric film which is formed as the mixture-suppression film 26 may be adjusted according to a desired bandgap difference ΔEg. In the first embodiment, for example, a $SiN_x$ film which has a refractive index of 2.05 and is formed under a Si-rich condition is used as the high refractive index film for forming the window region 23 and a $SiN_x$ film which has a refractive index of 1.85 and is formed under a N-rich condition is used as the low refractive index film for forming the non-window region. In this way, a bandgap difference of about 25 meV is ensured between the window region 23 and the non-window region 24.

As such, in the first embodiment, the low refractive index layer is formed as the mixture-suppression film 26 and the high refractive index layer with a density higher than that of the low refractive index layer is formed as the mixture-promoting film 25. Therefore, even when a thermal treatment is performed at a temperature that is significantly less than that in the related art, it is possible to cause the mixture in at least a portion of the semiconductor layer below the high refractive index film. Therefore, in the first embodiment, since the mixture can be achieved at a temperature lower than that in the related art, no crack occurs in the mixture-promoting film and the mixture-suppression film and thus it is possible to prevent the surface of a semiconductor from being roughened and prevent the mixing of the atoms of the non-window region. As a result, in the first embodiment, even when a thermal treatment is performed after the dielectric film is formed on the surface of the semiconductor layer, it is possible to reduce an adverse effect due to the thermal treatment and manufacture a desired semiconductor laser element.

Figure 13:
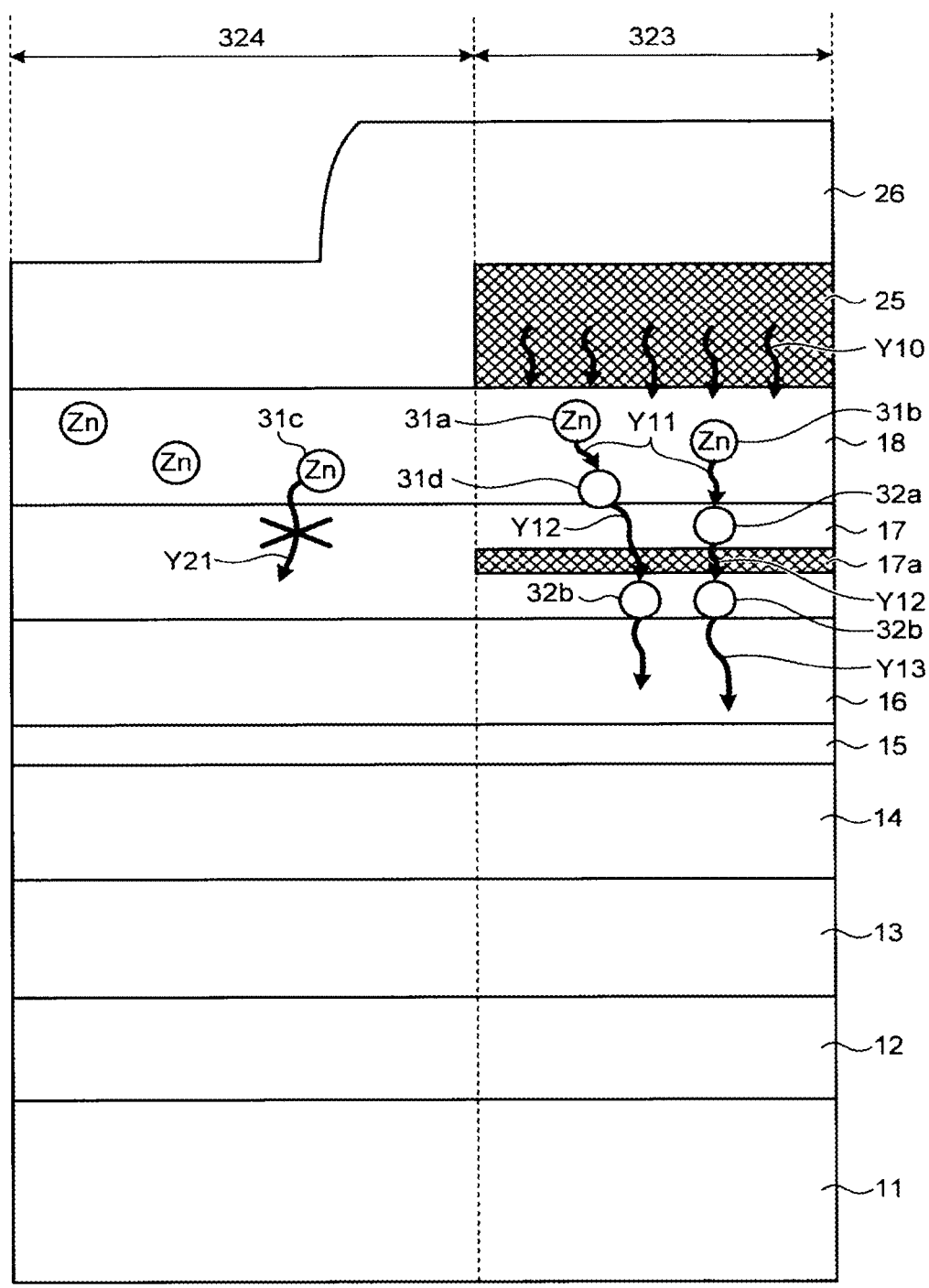
FIG. 13 is a cross-sectional view illustrating a mixture process according to the first embodiment, which is taken along the plane vertical to the x-axis of a main portion of the semiconductor laser element.

Next, a window region forming mechanism according to the first embodiment will be described with reference to FIG. 13. When the mixture-promoting film 25, which is a high refractive index film with high density, is formed in a region 323 corresponding to the window region 23, the mixture-suppression film 26, which is a low refractive index film with low density, is formed in a region 324 corresponding to the non-window region 24, and a thermal treatment is performed, a thermal expansion coefficient difference occurs due to a difference in density between the region 323 and the region 324 in the semiconductor laminated structure 10.

As a result, as represented by an arrow Y10, strong distortion occurs in the region 323 in which the high refractive index layer with high density is formed and the energy between the laminated structures becomes unstable due to the distortion. When the unstable energy is stabilized, Zn 31*b*, which is a diffusing species in the p-contact layer 18, is moved. It is considered that, in order to stabilize energy, the Zn 31*b* is moved in the p-contact layer 18 disposed immediately above the high refractive index layer in a direction opposite to the mixture-promoting film 25 causing distortion, that is, to the active layer 15, as represented by an arrow Y11. When the Zn 31*b* moves in the direction of the arrow Y11, the Zn 31*b* collides with an atom 31*d* forming the p-contact layer 18 or an atom 32*a* forming the p-cladding layer 17. The atoms 31*d* and 32*a* colliding with the Zn 31*b* sequentially move to the active layer 15, as represented by an arrow Y12. The moved atoms 31*d* and 32*a* collide with atoms 32*b* and the atoms 32*b* colliding with the atoms 31*d* and 32*a* also sequentially move to the active layer 15, as represented by an arrow Y13. When this operation is repeated, atoms and holes in each structural layer below the mixture-promoting film 25 move in an avalanche manner and mixture in the semiconductor layer of the region 323 are caused. In this way, the window region 23 is formed. As such, when a thermal treatment is performed on a $SiN_x$ film, which is a high refractive index film formed under a Si-rich condition, the $SiN_x$ film diffuses impurities in the semiconductor layer immediately below the $SiN_x$ film.

In the region 324 in which the mixture-suppression film 26 with a low density is formed, no distortion occurs. Therefore, Zn 31*c* in the p-contact layer 18 does not move to the active layer 15, as represented by an arrow Y21. Therefore, in the region 324 corresponding to the non-window region 24, the Zn 31*c*, which is a diffusing species, does not move. As a result, atoms or holes in the p-contact layer 18, the p-cladding layer 17, and the p-guide layer 16 do not move. Therefore, the mixture does not occur in the region 324 and the region 324 functions as the non-window region 24.

In the related art, the impurity concentration of the contact layer in the window region is equal to or greater than that of the contact layer in the non-window region. In contrast, in the first embodiment, because Zn in the p-contact layer 18 is diffused into another semiconductor layer to form the window region 23, the concentration of Zn in the p-contact layer 18 is reduced and the contact resistance of the upper electrode 20 increases. As a result, a leakage current is reduced.

Figure 14:
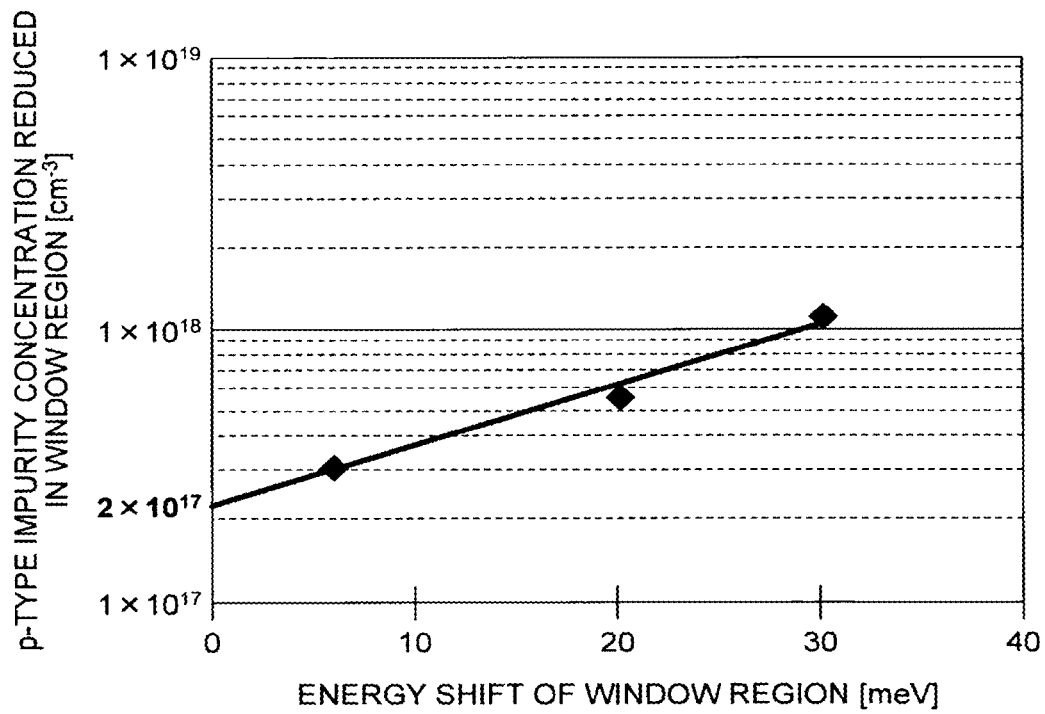
FIG. 14 is a diagram illustrating the relation between a p-type impurity concentration which is reduced in a p-contact layer due to a thermal treatment process and the bandgap variation in a window region.

Next, the amount of Zn, which is a p-type impurity in the p-contact layer 18, to be diffused in order to form the window region 23 will be described. In the semiconductor laser elements formed by performing a thermal treatment process under a plurality of conditions, the relation between p-type impurity concentration reduced in the p-contact layer 18 and the bandgap variation in the window region is calculated. FIG. 14 is a diagram illustrating the relation between the p-type impurity concentration which is reduced in the p-contact layer 18 by the thermal treatment process and the bandgap variation in the window region. Hereinafter, the bandgap variation due to the thermal treatment in the semiconductor layer will be described as an energy shift.

When the bandgap variation in the window region 23 is larger than the bandgap variation in the non-window region 24, it is possible to reduce the absorption of laser light by the window region 23. Therefore, the thermal treatment process needs to be performed to promote the mixture in the semiconductor laminated structure in the window region 23 such that the bandgap in the window region 23 is greater than the bandgap in the non-window region. In other words, when the mixture is promoted, the bandgap in the window region 23 is greater than the bandgap in the non-window region, and thus the energy shift becomes large. Therefore, it is considered that the energy shift also indicates the degree of mixture.

In FIG. 14, as the concentration of p-type impurities in the window region of the p-contact layer 18 is reduced, the energy shift in the window region increases. The reason is that, when a thermal treatment process is performed, Zn in a portion of the p-contact layer 18 corresponding to the window region moves to another semiconductor layer by diffusion and mixture is promoted in the semiconductor layer in the window region. Therefore, in the first embodiment, in order to promote the mixture in the window region, the thermal treatment process needs to be performed on condition that the amount of Zn diffused in the p-contact layer 18 below the mixture-promoting film 25 is greater than that of Zn diffused in the p-contact layer 18 below the mixture-suppression film 26 and the Zn concentration of the p-contact layer 18 below the mixture-promoting film 25 is less than the Zn concentration of the p-contact layer 18 below the mixture-suppression film 26.

As shown in FIG. 14, when a decrement in the concentration of p-type impurities in the window region of the p-contact layer 18 is less than $2\times10^{17}$ cm$^{-3}$, the energy shift of the window region is maintained to be zero. Therefore, the mixture is not sufficiently promoted in the semiconductor layer and the window region 23 is not appropriately formed. Therefore, in order to appropriately cause the mixture of the window region to shift the energy of the window region, it is necessary to perform the thermal treatment process on condition that a decrement in the concentration of p-type impurities in the p-contact layer 18 is greater than $2\times10^{17}$ cm$^{-3}$. That is, in the first embodiment, the thermal treatment process is performed such that the Zn concentration of the p-contact layer 18 below the mixture-promoting film 25 is less than the Zn concentration of the p-contact layer 18 below the mixture-suppression film 26 by $2\times10^{17}$ cm$^{-3}$ or more.

In the first embodiment, the SiN$_x$ films are formed as the high refractive index film and the low refractive index film on the semiconductor laminated structure. However, when a composition ratio can be changed to control density and a refractive index, the embodiment is not limited to the SiN$_x$ film. For example, SiO$_2$ films may be used as the high refractive index film and the low refractive index film. In this case, a SiO$_2$ film with high density and a high refractive index may be formed on the semiconductor laminated structure corresponding to the window region under a Si-rich condition and a SiO$_2$ film with low density and a low refractive index may be formed on the semiconductor laminated structure corresponding to the non-window region under an O-rich condition. A thermal treatment may be performed in the temperature range in which the bandgap variation due to the thermal treatment in the semiconductor laminated structure below the SiO$_2$ film which is formed under the Si-rich condition is greater than the bandgap variation due to the thermal treatment in the semiconductor laminated structure below the SiO$_2$ film which is formed under the O-rich condition, thereby achieving the mixture in the semiconductor laminated structure below the SiO$_2$ film which is formed under the Si-rich condition. In addition, when the density and refractive index of the dielectric films formed in the non-window region and the window region can be controlled, the embodiment is not limited to the same kind of dielectric films made of the same material, but different kinds of dielectric films made of different materials may be used.

Figure 15:
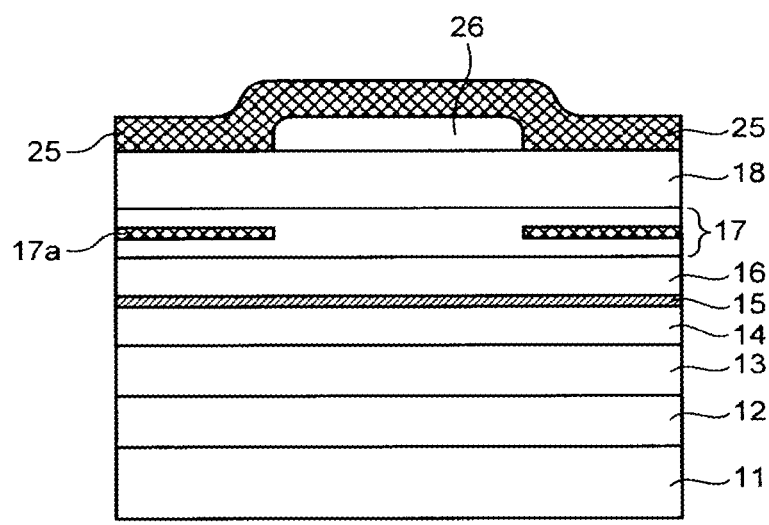
FIG. 15 is a cross-sectional view illustrating another example of the process of manufacturing the semiconductor laser element shown in FIG. 1, which is taken along the plane vertical to the x-axis of the semiconductor laser element shown in FIG. 1.
Figure 16:
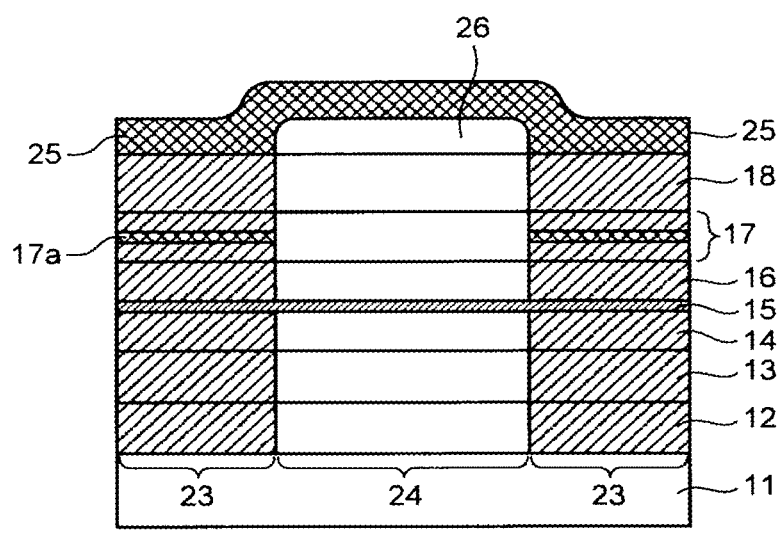
FIG. 16 is a cross-sectional view illustrating another example of the process of manufacturing the semiconductor laser element shown in FIG. 1, which is taken along the plane vertical to the x-axis of the semiconductor laser element shown in FIG. 1.

In the first embodiment, in FIGS. 5 and 6, the SiN$_x$ film is formed as the mixture-promoting film 25 under the Si-rich condition before the SiN$_x$ film is formed as the mixture-suppression film 26 under the N-rich condition. However, the embodiment is not limited thereto. Specifically, as shown in FIG. 15, a SiN$_x$ film may be deposited on the p-contact layer 18 under an N-rich condition, and then a photolithography process and an etching process may be performed to remove the SiN$_x$ film in a region other than the region corresponding to the non-window region 24, thereby forming the mixture-suppression film 26. Then, as shown in FIG. 16, a SiN$_x$ film may be deposited on the p-contact layer 18 and the mixture-suppression film 26 under a Si-rich condition to form the mixture-promoting film 25.

Second Embodiment

Figure 17:
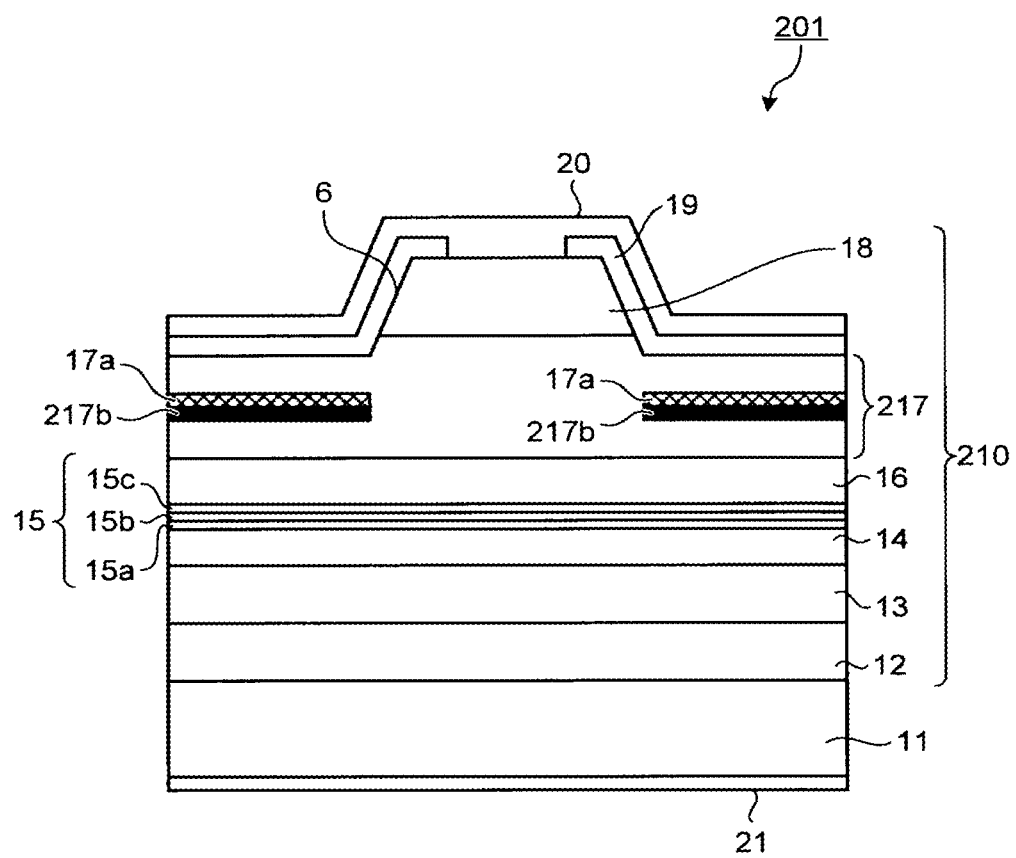
FIG. 17 is a cross-sectional view illustrating a semiconductor laser element according to a second embodiment taken along the plane vertical to the z-axis.

Next, a second embodiment will be described. FIG. 17 is a cross-sectional view illustrating a semiconductor laser according to the second embodiment taken along the plane vertical to the z-axis and FIG. 18 is a cross-sectional view illustrating a semiconductor laser according to the second embodiment taken along the plane vertical to the x-axis.

Figure 18:
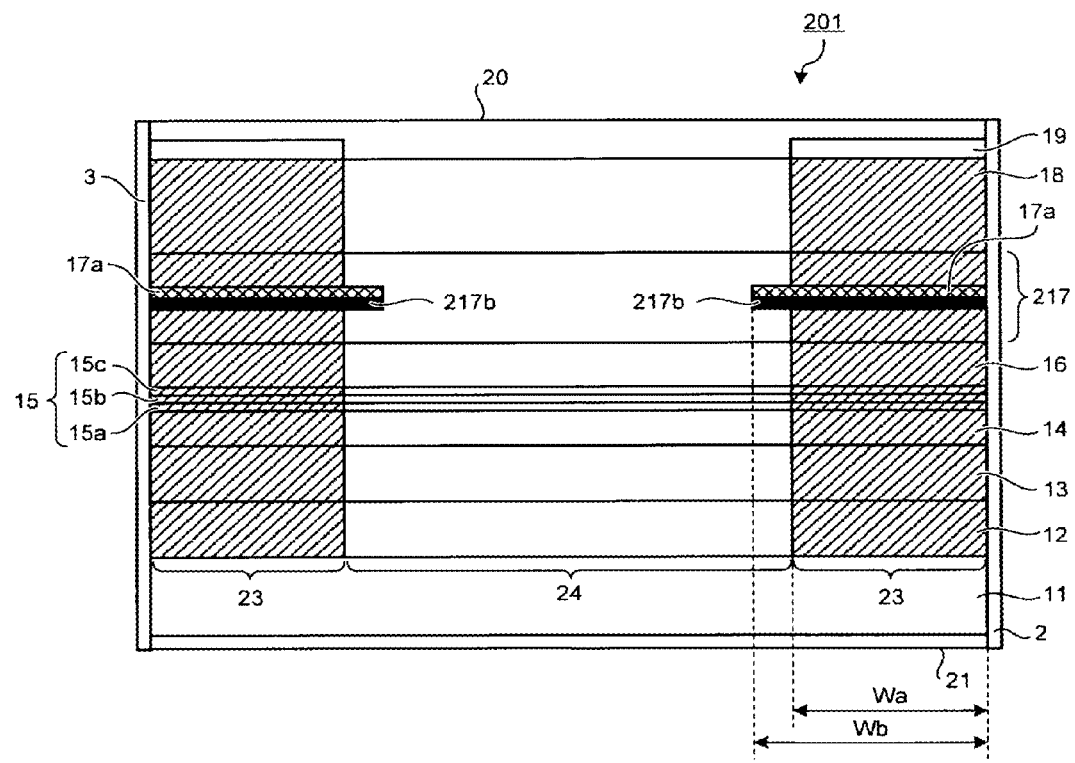
FIG. 18 is a cross-sectional view illustrating the semiconductor laser element according to the second embodiment taken along the plane which is vertical to the x-axis and passes through a ridge portion.

As shown in FIGS. 17 and 18, a semiconductor laminated structure 210 of a semiconductor laser element 201 according to the second embodiment includes a p-cladding layer 217 having a diffusion layer 217b, in addition to the current-confined layer 17a. The diffusion layer 217b is provided between the current-confined layer 17a and the active layer 15 and is disposed immediately below the current-confined layer 17a. The diffusion layer 217b is a semiconductor layer which is made of the same material as that forming the p-cladding layer 217 and includes Zn, which is a diffusing species, at high concentration.

Figure 19:
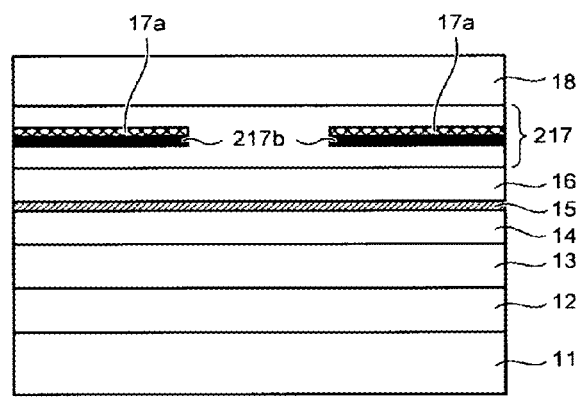
FIG. 19 is a cross-sectional view illustrating a process of manufacturing the semiconductor laser element shown in FIG. 18.
Figure 20:
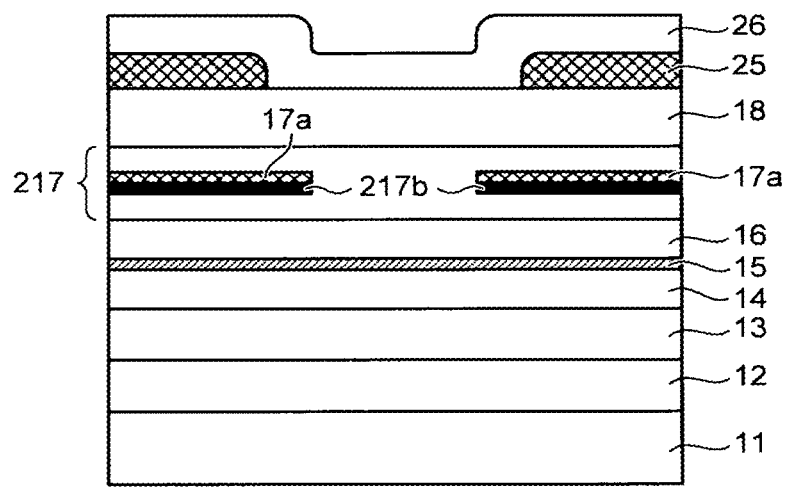
FIG. 20 is a cross-sectional view illustrating the process of manufacturing the semiconductor laser element shown in FIG. 18.
Figure 21:
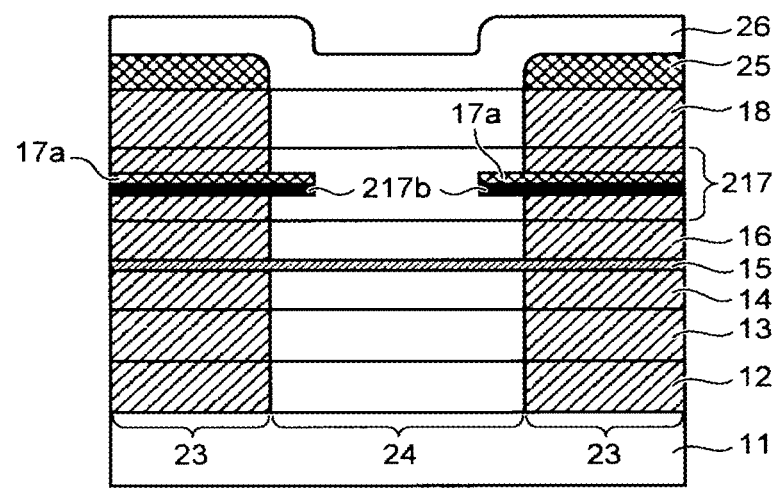
FIG. 21 is a cross-sectional view illustrating the process of manufacturing the semiconductor laser element shown in FIG. 18.

Next, a process of manufacturing the semiconductor laser element 201 will be described with reference to FIGS. 19 to 21. As shown in FIG. 19, similarly to the first embodiment, the n-buffer layer 12, the n-cladding layer 13, the n-guide layer 14, the active layer 15, and the p-guide layer 16 are formed on the GaAs semiconductor substrate 11. The diffusion layer 217b with a higher concentration of Zn than the other regions and the current-confined layer 17a including n-type impurities are formed so as to correspond only to the window region, and doping of Zn is performed in the other regions to form the p-cladding layer 217. Then, the same process as that in the first embodiment is performed to form the p-contact layer 18. Then, the same process as that shown in FIG. 5 is performed to form the mixture-promoting film 25 in a region corresponding to the window region 23 and form the mixture-suppression film 26 in a region corresponding to the non-window region 24 in the surface of the p-contact layer 18, as shown in FIG. 20. Then, the same thermal treatment process as that in the first embodiment is performed to form the window region 23 shown in FIG. 21. Then, the same process as that shown in FIG. 7 is performed to form a ridge structure and the same process as that shown in FIG. 8 is performed to form the upper electrode 20 and the lower electrode 21. Then, a semiconductor wafer is cleaved and the high-reflection film 2 and the low-reflection film 3 are formed on the cleavage surfaces. Then, the semiconductor laser elements 201 are individually cut.

Figure 22:
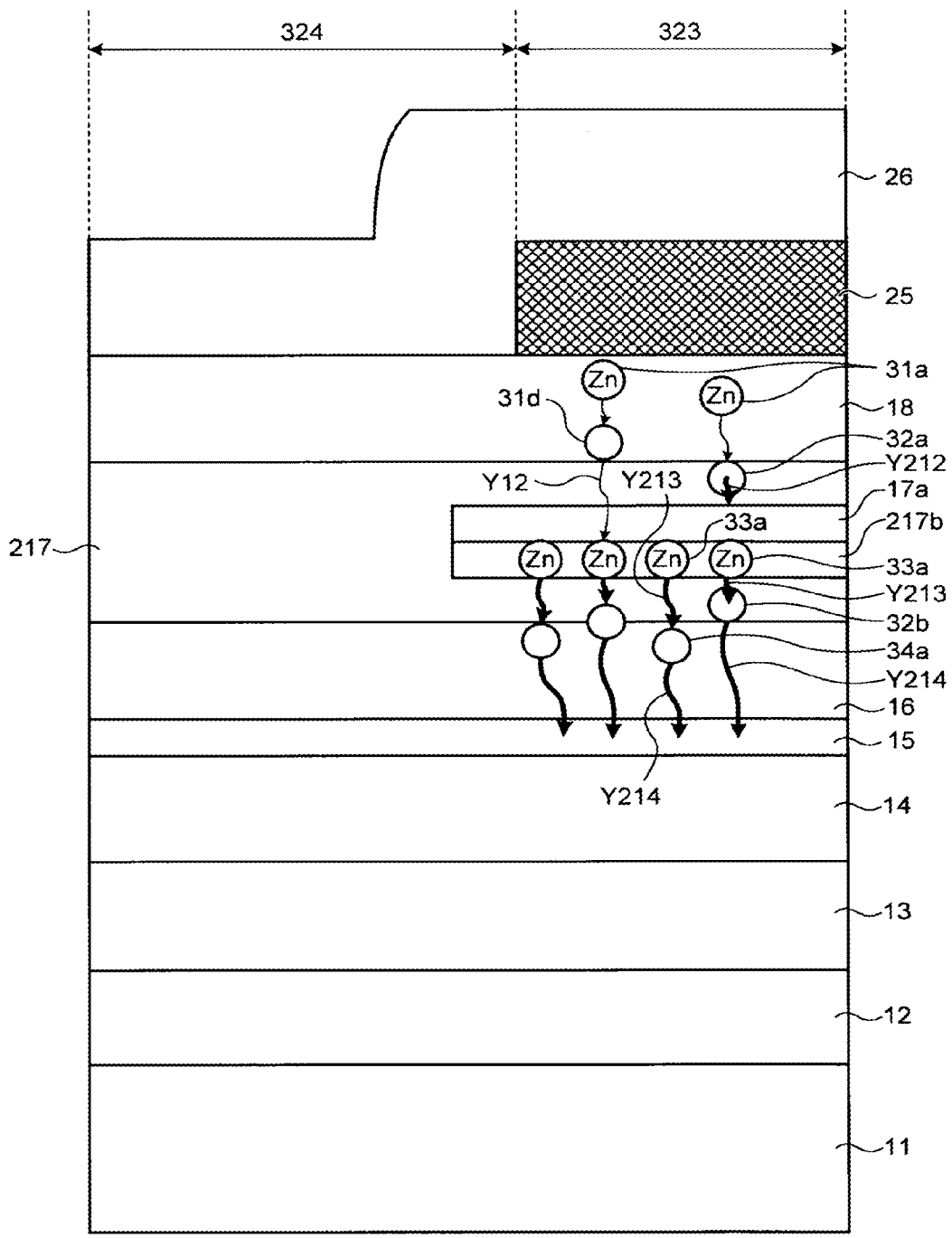
FIG. 22 is a cross-sectional view illustrating a mixture process according to the second embodiment, which is taken along the plane vertical to the x-axis of a main portion of the semiconductor laser element.

In the second embodiment, the diffusion layer 217b including Zn, which is a diffusing species, at high concentration is further formed between the current-confined layer 17a and the active layer 15. Similarly to Zn included in the p-contact layer 18, Zn included in the diffusion layer 217b is diffused by a thermal treatment process. Therefore, as shown in FIG. 22, in the thermal treatment process, Zn 33a in the diffusion layer 217b moves to the active layer 15, as represented by an arrow Y213 and collides with atoms 32b forming the p-cladding layer 217 or atoms 34a forming the p-guide layer 16. The atoms 32b and 34a colliding with the Zn 33a sequentially move to the active layer 15, as represented by an arrow Y214. Therefore, among Zn 31a and the atoms 31d and 32a moving in an avalanche manner as represented by an arrow Y12, even if there is an atom 32a which does not collide with the next atom and is stopped as represented by an arrow Y212, Zn 33a in the diffusion layer 217b which is provided closer to the active layer 15 than to the p-contact layer 18 moves to supplement the atoms 32b and 34a moving to the active layer 15.

Therefore, in the second embodiment, the number of atoms and holes reaching the active layer 15 is increased by the movement of the Zn 33a in the diffusion layer 217b. As a result, it is possible to sufficiently promote the mixture and achieve a semiconductor laser element with a high performance, as compared to the first embodiment.

In the second embodiment, as shown in FIG. 18, when the semiconductor laser element 1 is cut along the plane vertical to the laminated direction, the current-confined layer 17a is formed such that the length Wb of the current-confined layer 17a from the end of the semiconductor laser element 1 is greater than the length Wa of the window region 23 from the end of the semiconductor laser element. As such, when the length Wb of the current-confined layer 17a from the end of the semiconductor laser element 1 is greater than the length Wa of the window region 23 from the end of the semiconductor laser element, it is possible to reliably prevent the diffusion of Zn into a current injection region and thus reduce a leakage current.

In the first and second embodiments, the current-confined layer 17a is formed such that the lattice constant thereof is greater than the lattice constants of the semiconductor layers formed above and below the current-confined layer 17a. When the lattice constant of the current-confined layer 17a is set in this way, Zn, which is a diffusing species, passes between the lattices of the current-confined layer 17a. Therefore, it is possible to effectively move each atom and appropriately cause the mixture in the active layer 15.

In the second embodiment, the diffusion layer 217b is formed between the current-confined layer 17a and the active layer 15 such that, among Zn, which is a diffusing species, and the atoms which collide with Zn and then move, a large amount of Zn and a large number of atoms reach the active layer 15. However, the embodiment is not limited thereto. The diffusion layer 217b may be provided between the active layer 15 and the p-contact layer 18 including Zn, which is a diffusing species, so as to supplement Zn, which is a diffusing species. In addition, a plurality of diffusion layers 217b may be provided to sufficiently supplement Zn, which is a diffusing species.

In the first and second embodiments, Zn, which is a p-type impurity, is used as the diffusing species, but the diffusing species is not limited to Zn. For example, the diffusing species may be other p-type impurities, such as Mg and Be. In the second embodiment, as the diffusing species of the diffusion layer 217b, n-type impurities, such as Si and Se, may be used as well as the p-type impurities. In addition, interface impurities, such as O, C, H, and S, may be intermixed during re-growth, or holes may be introduced during low-temperature crystal growth.

In the first and second embodiments, the semiconductor laser element having the ridge structure is given as an example. However, the embodiments are not limited to the semiconductor laser element having the ridge structure. In both of the embodiments, the structure in which the n-buffer layer 12, the n-cladding layer 13, the n-guide layer 14, the active layer 15, the p-guide layer 16, the p-cladding layer 217, and the p-contact layer 18 are formed on the GaAs semiconductor substrate 11 is given as a preferred example. However, a p-buffer layer, a p-cladding layer, a p-guide layer, an active layer, an n-guide layer, an n-cladding layer, and an n-contact layer may be sequentially formed on the GaAs semiconductor substrate 11. In addition, substrates made of other materials, such as InP, or laminated structures formed by other material systems may be used according to a desired oscillation wavelength.

Figure 23:
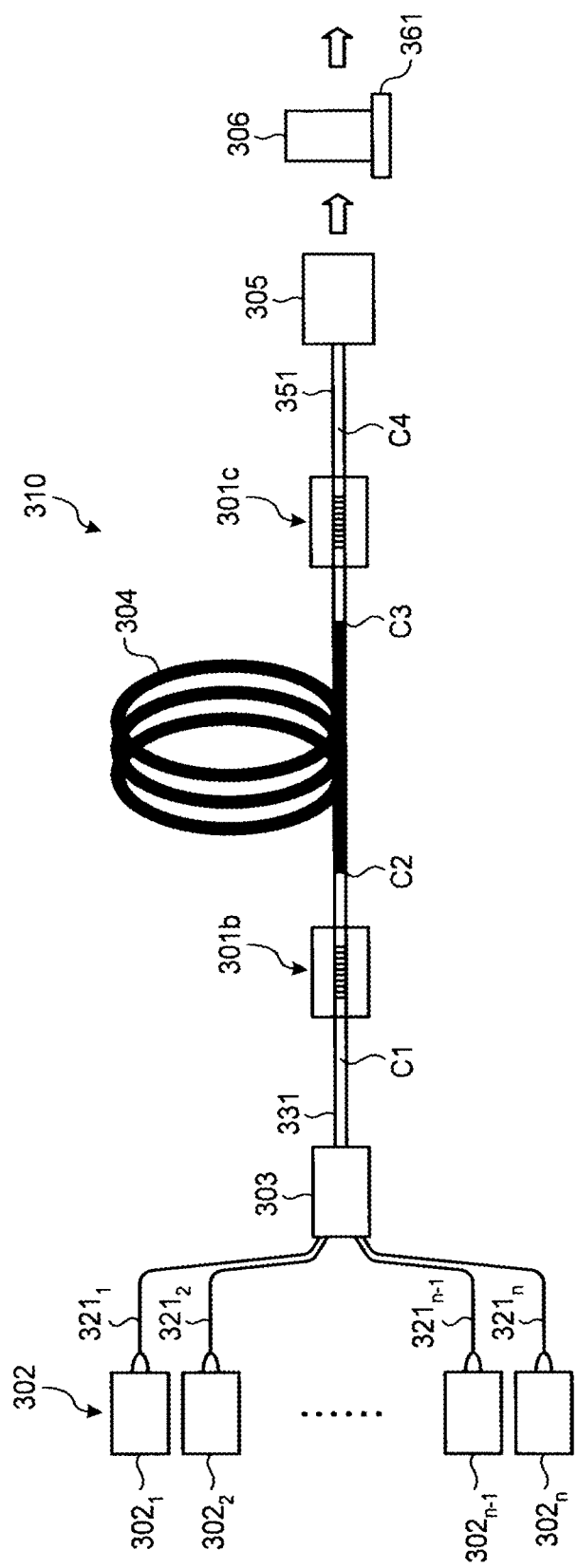
FIG. 23 is a diagram schematically illustrating a communication system using the semiconductor laser element according to the first or second embodiment.

The laser element according to the invention can be applied to a semiconductor laser module that is coupled to an optical fiber, a transmitter used in optical communication, or a communication system which has high-power characteristics according to the invention and in which the distance between a transmitter and a receiver (or a repeater) is long, which has not been achieved in the related art. For example, as in a communication system 310 shown in FIG. 23, the semiconductor laser element according to the first and second embodiments may be used to form an excitation light source 302. The excitation light source 302 includes semiconductor laser elements $302_1$ to $302_n$ described in the first and second embodiments. The communication system 310 includes, in addition to the excitation light source 302, multi-mode optical fibers $321_1$ to $321_n$ that guide excitation light output from the semiconductor laser elements $302_1$ to $302_n$, a tapered fiber bundle (TFB) 303 that combines the excitation light guided by the multi-mode optical fibers $321_1$ to $321_n$ and outputs the combined light to a double-clad optical fiber 331, an optical fiber grating device 301b that is connected to the double-clad optical fiber 331 at a connection point C1, an optical fiber 304 that is connected to the optical fiber grating device 301b at a connection point C2, an optical fiber grating device 301c that has the same structure as the optical fiber grating device 301b and is connected to the optical fiber 304 at a connection point C3, a collimator component 305 including a single mode optical fiber 351 which is connected to the optical fiber grating device 301c at a connection point C4, and a wavelength conversion element 306 that is provided on the output end side of the collimator component 305 and is mounted on an optical stage 361. In general, the optical fiber 304 has a length of 2 Km or more and each device and each optical fiber are optically coupled to each other.

In the first and second embodiments, the manufacture of the semiconductor laser element is given as an example, but the embodiments are not limited thereto. The invention can be applied to, for example, a light emitting diode and a light receiving device having an optical waveguide structure. That is, the invention can be applied to an optical device which has the semiconductor laminated structure as the main structure and is manufactured by a method including a process of mixture in a predetermined semiconductor layer of the semiconductor laminated structure.

Figure 24:
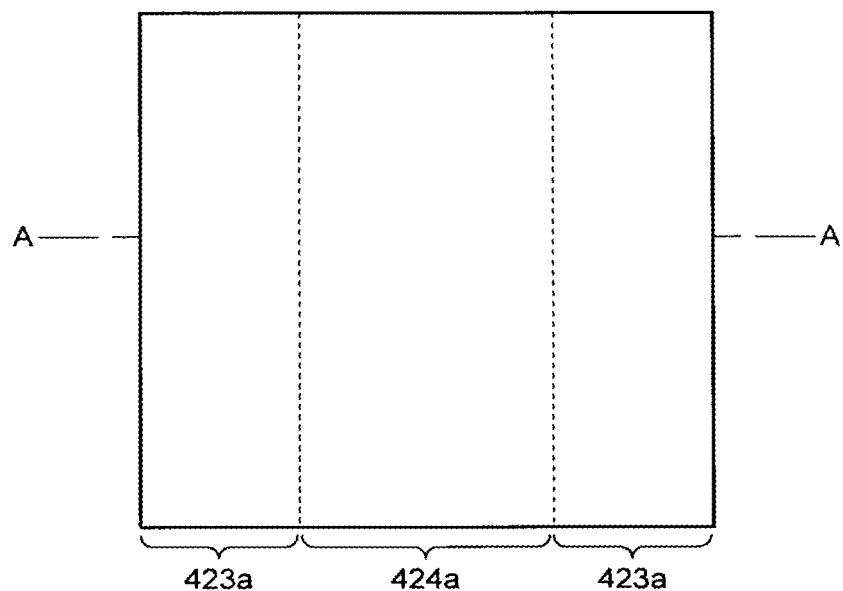
FIG. 24 is a plan view illustrating an optical device manufactured by an optical device manufacturing method according to an embodiment.
Figure 25:
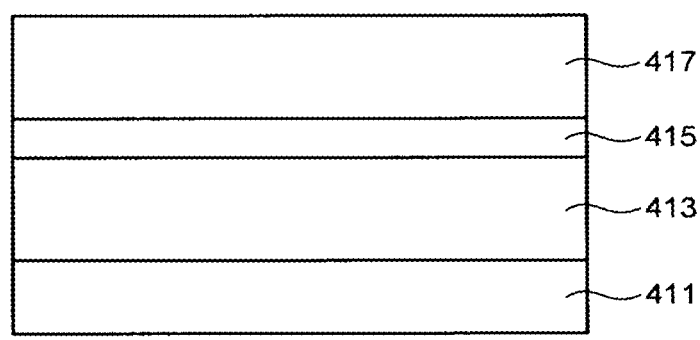
FIG. 25 is a cross-sectional view illustrating a process of manufacturing the optical device shown in FIG. 24 taken along the line A-A of the optical device shown in FIG. 24.
Figure 26:
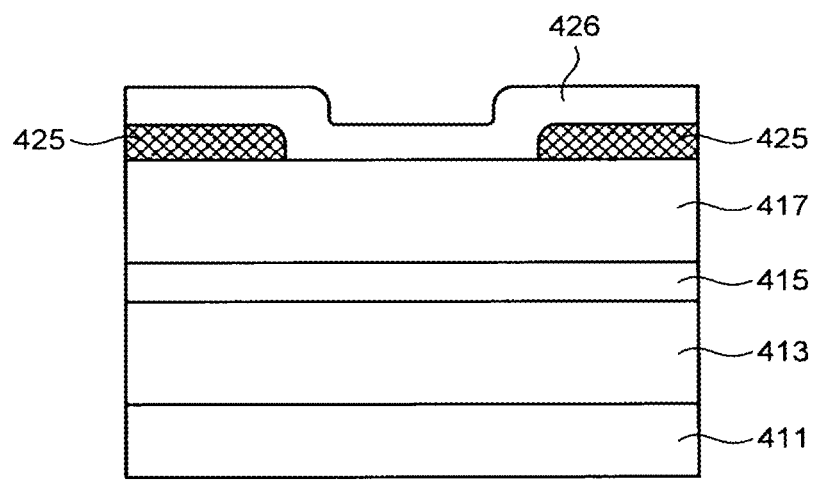
FIG. 26 is a cross-sectional view illustrating the process of manufacturing the optical device shown in FIG. 24 taken along the line A-A of the optical device shown in FIG. 24.
Figure 27:
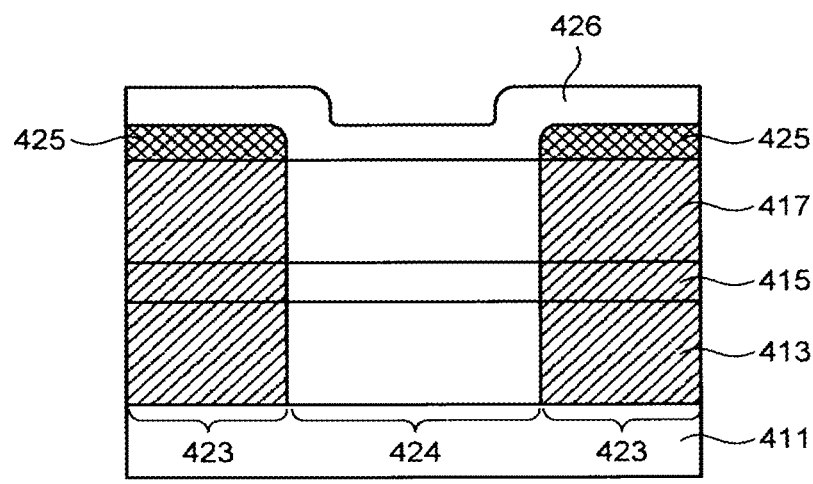
FIG. 27 is a cross-sectional view illustrating the process of manufacturing the optical device shown in FIG. 24 taken along the line A-A of the optical device shown in FIG. 24.

Next, a method of manufacturing, as the above-mentioned optical device, an optical device including a mixed clad region 423a and a core region 424a serving as an optical waveguide region as shown in FIG. 24 will be described. FIGS. 25 to 27 are cross-sectional views taken along the line A-A of FIG. 24. As shown in FIG. 25, first, a semiconductor laminated structure including a lower cladding layer 413, an optical waveguide layer 415, and an upper cladding layer 417 is epitaxially grown on a predetermined substrate 411. Then, as shown in FIG. 26, a high refractive index film 425 with high density is formed in a region of the surface of the upper cladding layer 417 corresponding to a cladding region and a low refractive index film 426 with low density is formed in a region of the surface of the upper cladding layer 417 corresponding to a core region. Then, a thermal treatment is performed in the temperature range in which the bandgap variation due to the thermal treatment in the semiconductor layer below the high refractive index film 425 is greater than the bandgap variation due to the thermal treatment in the semiconductor layer below the low refractive index film 426. As a result, as shown in FIG. 27, mixture is caused in at least a portion of the semiconductor layer below the high refractive index film 425, that is, at least a portion of a region 423 corresponding to the cladding region. In addition, since the low refractive index film 426 is formed in a region 424 corresponding to the core region, the mixture in the semiconductor layer does not occur.

After the thermal treatment process ends, other necessary processes are performed to complete the optical device. For example, structures other than the semiconductor laminated structure forming the optical device are added and/or processes different from the surface treatment or the thermal treatment performed on the semiconductor laminated structure are performed. For example, when the optical device is a light emitting device or a light receiving device, processes, such as an etching process of physically processing the semiconductor laminated structure to form the body of the light emitting device or the light receiving device, a process of forming a passivation film, a process of forming an electrode, and a process of forming a reflecting film, are performed to complete the optical device.

The invention is not limited to the semiconductor laser, but can be applied to devices having a refractive index difference, such as waveguide devices.

REFERENCE SIGNS LIST 1, 201 SEMICONDUCTOR LASER ELEMENT
2 HIGH-REFLECTION FILM
3 LOW-REFLECTION FILM
4 LASER LIGHT
5 EMISSION REGION
6 RIDGE
10, 210 SEMICONDUCTOR LAMINATED STRUCTURE
11, 411 SUBSTRATE
12 n-BUFFER LAYER
13 n-CLADDING LAYER
14 n-GUIDE LAYER
15 ACTIVE LAYER
15a LOWER BARRIER LAYER
15b QUANTUM WELL LAYER
15c UPPER BARRIER LAYER
16 p-GUIDE LAYER
17, 217 p-CLADDING LAYER
17a CURRENT-CONFINED LAYER
18 p-CONTACT LAYER
19 INSULATION LAYER
20 UPPER ELECTRODE
21 LOWER ELECTRODE
23, 323 WINDOW REGION
24, 324 NON-WINDOW REGION
25 MIXTURE-PROMOTING FILM
26 MIXTURE-SUPPRESSION FILM
217b DIFFUSION LAYER
302 EXCITATION LIGHT SOURCE
$302_1$ to $302_n$ SEMICONDUCTOR LASER ELEMENT
304 OPTICAL FIBER
305 COLLIMATOR COMPONENT
306 WAVELENGTH CONVERSION ELEMENT
310 COMMUNICATION SYSTEM
$321_1$ to $321_n$ MULTI-MODE OPTICAL FIBER
331 DOUBLE-CLAD OPTICAL FIBER
351 SINGLE MODE OPTICAL FIBER
361 OPTICAL STAGE
413 LOWER CLADDING LAYER
415 OPTICAL WAVEGUIDE LAYER
417 UPPER CLADDING LAYER
423a INTERMIXED CLAD REGION
424a CORE REGION
425 HIGH REFRACTIVE INDEX FILM
426 LOW REFRACTIVE INDEX FILM

The invention claimed is:

1. An edge-emitting semiconductor optical device comprising:
   a first electrode;
   a semiconductor substrate;
   a laminated structure including a first conductive type cladding layer, an active layer, a second conductive type cladding layer, and a contact layer doped with a second conductive type impurity which are sequentially formed on the substrate;
   a second electrode that is formed on the contact layer such that a current path is formed through the laminated structure between the first electrode and the second electrode; and
   a window region that is provided at least in the vicinity of an end face of a laser light emitting side and has a bandgap larger than that of a non-window region,
   wherein a concentration of the second conductive type impurity in the window region of the contact layer is less than that of the second conductive type impurity in the non-window region of the contact layer.

2. The semiconductor optical device according to claim 1, wherein the concentration of the second conductive type impurity in the window region of the contact layer is less than the concentration of the second conductive type impurity in the non-window region of the contact layer by $2 \times 10^{17}$ cm$^{-3}$ or more.

3. The semiconductor optical device according to claim 1, wherein a current-confined layer is formed in the window region between the contact layer and the active layer.

4. The semiconductor optical device according to claim 3, wherein the current-confined layer extends from the window region to a portion of the non-window region.

5. The semiconductor optical device according to claim 3, wherein the laminated structure has a plurality of semiconductor layers, and
   the current-confined layer has a lattice constant larger than those of the semiconductor layers formed above and below the current-confined layer.

6. The semiconductor optical device according to claim 1, further comprising:
   a diffusion layer that includes a diffusing species and is provided between the contact layer and the active layer.

7. The semiconductor optical device according to claim 3, further comprising:
   a diffusion layer that includes a diffusing species and is provided below the current-confined layer,
   wherein the diffusion layer is formed in the same region as the current-confined layer.

8. The semiconductor optical device according to claim 1, wherein the substrate and the laminated structure are made of a group III-V compound.

9. The semiconductor optical device according to claim 1, wherein the second conductive type impurity is Zn, Mg, or Be.

10. The semiconductor optical device according to claim 6 or 7,
    wherein the diffusing species is any one of a p-type impurity including Zn, Mg, or Be, an n-type impurity including Si or Se, an interface impurity including O, C, H, or S, and holes.

11. A communication system comprising:
    a transmitter including the semiconductor optical device according to claim 1;
    an optical fiber that is optically connected to the transmitter at one end of the optical fiber and has a length of 2 km or more; and
    a receiver that is optically coupled to the optical fiber at the other end of the optical fiber.

* * * * *